(12) United States Patent
Hori et al.

(10) Patent No.: US 11,320,740 B2
(45) Date of Patent: May 3, 2022

(54) TARGET SUPPLY DEVICE, TARGET SUPPLY METHOD, AND ELECTRONIC DEVICE MANUFACTURING METHOD

(71) Applicant: Gigaphoton Inc., Tochigi (JP)

(72) Inventors: Tsukasa Hori, Oyama (JP); Yutaka Shiraishi, Oyama (JP); Toshihiro Nishisaka, Oyama (JP); Hiroshi Someya, Oyama (JP); Yukio Watanabe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/228,000

(22) Filed: Apr. 12, 2021

(65) Prior Publication Data

US 2021/0364927 A1    Nov. 25, 2021

(30) Foreign Application Priority Data

May 21, 2020    (JP) .............................. JP2020-088560

(51) Int. Cl.
*G03F 7/20* (2006.01)
*H05G 2/00* (2006.01)
*H01L 21/027* (2006.01)

(52) U.S. Cl.
CPC .......... *G03F 7/70033* (2013.01); *H05G 2/006* (2013.01); *H05G 2/008* (2013.01); *H01L 21/0274* (2013.01)

(58) Field of Classification Search
None
See application file for complete search history.

(56) References Cited

U.S. PATENT DOCUMENTS

| | | | |
|---|---|---|---|
| 2006/0192154 A1 | 8/2006 | Algots et al. | |
| 2006/0192155 A1 | 8/2006 | Algots et al. | |
| 2008/0067456 A1* | 3/2008 | Kloepfel | H05G 2/003 250/504 R |

(Continued)

FOREIGN PATENT DOCUMENTS

| | | |
|---|---|---|
| DE | 10 2009 020 776 A1 | 11/2010 |
| JP | H06-275535 A | 9/1994 |

(Continued)

OTHER PUBLICATIONS

A Search Report issued by the Netherlands Patent Office dated Feb. 16, 2022, which corresponds to Dutch Patent Application No. 2027804 and is related to U.S. Appl. No. 17/228,000; with partial English language explanation.

*Primary Examiner* — Michelle M Iacoletti
(74) *Attorney, Agent, or Firm* — Studebaker & Brackett PC

(57) ABSTRACT

A target supply device may include a first container configured to contain a target substance, a second container configured to contain the target substance supplied from the first container, a first valve disposed between the first container and the second container, a first pipe connected to the second container and configured to supply pressurized gas to the second container, a third container configured to contain the target substance supplied from the second container, a second valve disposed between the second container and the third container, a second pipe connected to the third container and configured to supply pressurized gas to the third container, and a nozzle configured to output the target substance supplied from the third container.

19 Claims, 21 Drawing Sheets

(56) References Cited

U.S. PATENT DOCUMENTS

| | | |
|---|---|---|
| 2010/0282987 A1 | 11/2010 | Hergenhan et al. |
| 2012/0292527 A1* | 11/2012 | Fomenkov .............. H05H 1/46 |
| | | 250/432 R |
| 2014/0253716 A1 | 9/2014 | Saito et al. |
| 2017/0350745 A1 | 12/2017 | Nagano et al. |
| 2019/0237303 A1 | 8/2019 | Iwamoto et al. |

FOREIGN PATENT DOCUMENTS

| | | |
|---|---|---|
| JP | 2013-191577 A | 9/2013 |
| JP | 2015053292 A | 3/2015 |
| JP | 2019-053308 A | 4/2019 |

* cited by examiner

FIG. 4

| S11 | VALVES V1 TO V4, V6, AND V7 ARE CLOSED |
|---|---|
| S12 | OPEN VALVE V4 |
| S13 | ADJUST INSIDE OF PRESSURE TANK C3 TO HIGH PRESSURE |
| S14 | PROCEED TO NEXT AFTER CERTAIN TIME PERIOD ELAPSES |
| S21 | OPEN VALVE V1 |
| S22 | MEASURE TARGET SUBSTANCE |
| S23 | CLOSE VALVE V1 |
| S31 | ACTIVATE EXHAUST PUMP 63 AND OPEN VALVE V6 |
| S32 | CLOSE VALVE V6 AND STOP EXHAUST PUMP 63 |
| S41 | CLOSE VALVE V4 AND OPEN VALVE V3 |
| S42 | CLOSE VALVE V3 AND OPEN VALVE V4 |
| S52 | OPEN VALVE V2 |
| S54 | CLOSE VALVE V2 |
| S61 | OPEN VALVE V7 |
| S62 | CLOSE VALVE V7 |
| S63 | RETURN TO S14 |

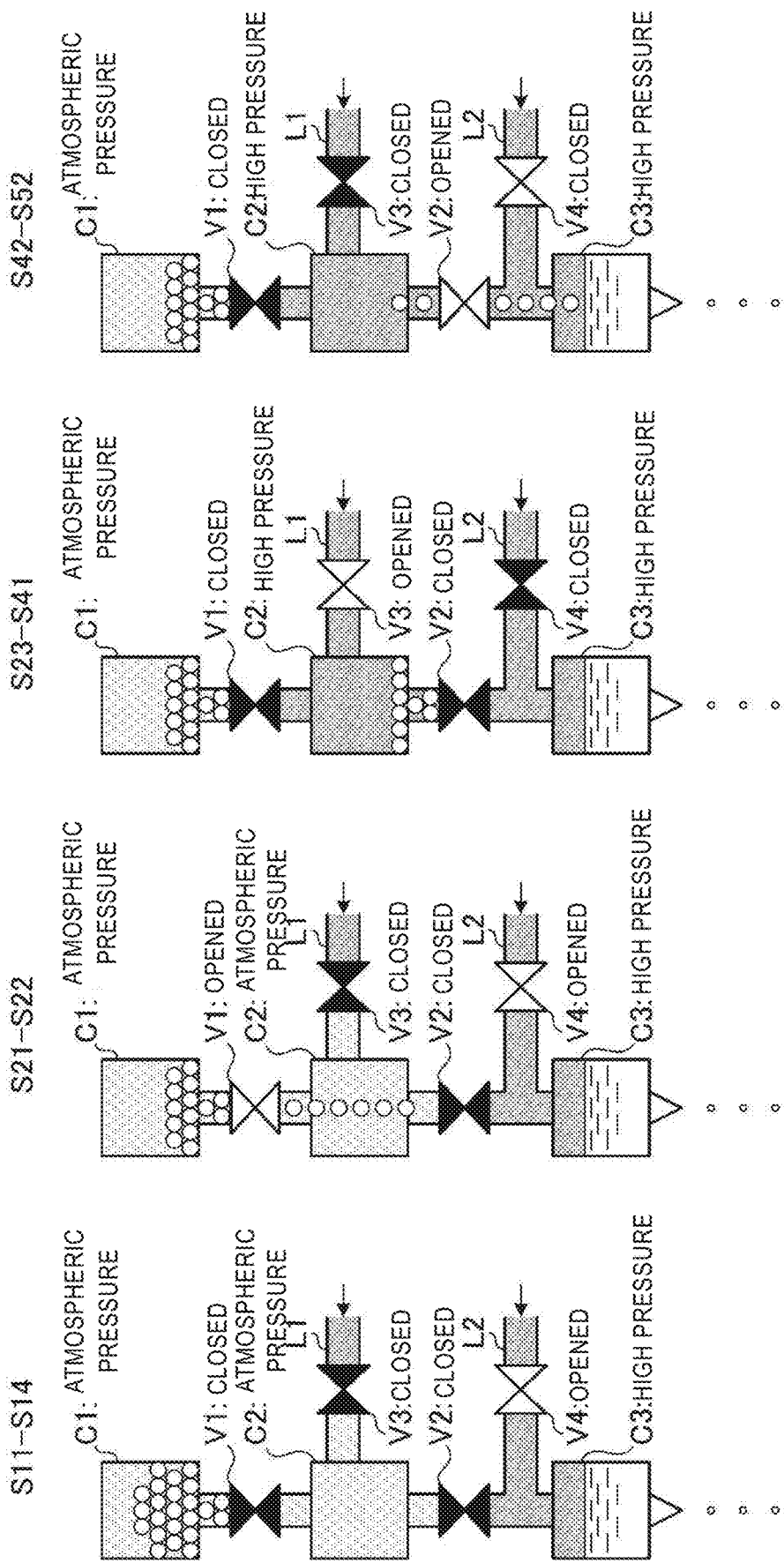

FIG. 7

| S11 | VALVES V1 TO V7 ARE CLOSED |
|---|---|
| S12 | OPEN VALVE V4 |
| S13 | ADJUST INSIDE OF PRESSURE TANK C3 TO HIGH PRESSURE |
| S14 | PROCEED TO NEXT AFTER CERTAIN TIME PERIOD ELAPSES |
| S21 | OPEN VALVE V1 |
| S22 | MEASURE TARGET SUBSTANCE |
| S23 | CLOSE VALVE V1 |
| S31 | ACTIVATE EXHAUST PUMP 63 AND OPEN VALVE V6 |
| S32 | CLOSE VALVE V6 AND STOP EXHAUST PUMP 63 |
| S41 | CLOSE VALVE V4 AND OPEN VALVE V3 |
| S42 | CLOSE VALVE V3 AND OPEN VALVE V4 |
| S51a | OPEN VALVE V5 |
| S52 | OPEN VALVE V2 |
| S54 | CLOSE VALVE V2 |
| S55a | CLOSE VALVE V5 |
| S61 | OPEN VALVE V7 |
| S62 | CLOSE VALVE V7 |
| S63 | RETURN TO S14 |

FIG. 10

| S11 | VALVES V1 TO V7 ARE CLOSED |
|---|---|
| S12 | OPEN VALVE V4 |
| S13 | ADJUST INSIDE OF PRESSURE TANK C3 TO HIGH PRESSURE |
| S14 | PROCEED TO NEXT AFTER CERTAIN TIME PERIOD ELAPSES |
| S21 | OPEN VALVE V1 |
| S22 | MEASURE TARGET SUBSTANCE |
| S23 | CLOSE VALVE V1 |
| S31 | ACTIVATE EXHAUST PUMP 63 AND OPEN VALVE V6 |
| S32 | CLOSE VALVE V6 AND STOP EXHAUST PUMP 63 |
| S41 | CLOSE VALVE V4 AND OPEN VALVE V3 |
| S42 | CLOSE VALVE V3 AND OPEN VALVE V4 |
| S51a | OPEN VALVE V5 |
| S52 | OPEN VALVE V2 |
| S53b | SET ADJUSTMENT MECHANISM 66 TO SECOND STATE |
| S54 | CLOSE VALVE V2 |
| S55a | CLOSE VALVE V5 |
| S56b | SET ADJUSTMENT MECHANISM 66 TO FIRST STATE |
| S61 | OPEN VALVE V7 |
| S62 | CLOSE VALVE V7 |
| S63 | RETURN TO S14 |

FIG. 12

| S11 | VALVES V1 TO V7 ARE CLOSED |
|---|---|
| S12 | OPEN VALVE V4 |
| S13 | ADJUST INSIDE OF PRESSURE TANK C3 TO HIGH PRESSURE |
| S14c | PROCEED TO NEXT WHEN LIQUID LEVEL IN PRESSURE TANK C3 BECOMES LOWER THAN FIRST LIQUID LEVEL |
| S21 | OPEN VALVE V1 |
| S22 | MEASURE TARGET SUBSTANCE |
| S23 | CLOSE VALVE V1 |
| S31 | ACTIVATE EXHAUST PUMP 63 AND OPEN VALVE V6 |
| S32 | CLOSE VALVE V6 AND STOP EXHAUST PUMP 63 |
| S41 | CLOSE VALVE V4 AND OPEN VALVE V3 |
| S42 | CLOSE VALVE V3 AND OPEN VALVE V4 |
| S51a | OPEN VALVE V5 |
| S52 | OPEN VALVE V2 |
| S53b | SET ADJUSTMENT MECHANISM 66 TO SECOND STATE |
| S54 | CLOSE VALVE V2 |
| S55a | CLOSE VALVE V5 |
| S56b | SET ADJUSTMENT MECHANISM 66 TO FIRST STATE |
| S61 | OPEN VALVE V7 |
| S62 | CLOSE VALVE V7 |
| S63 | RETURN TO S14c |

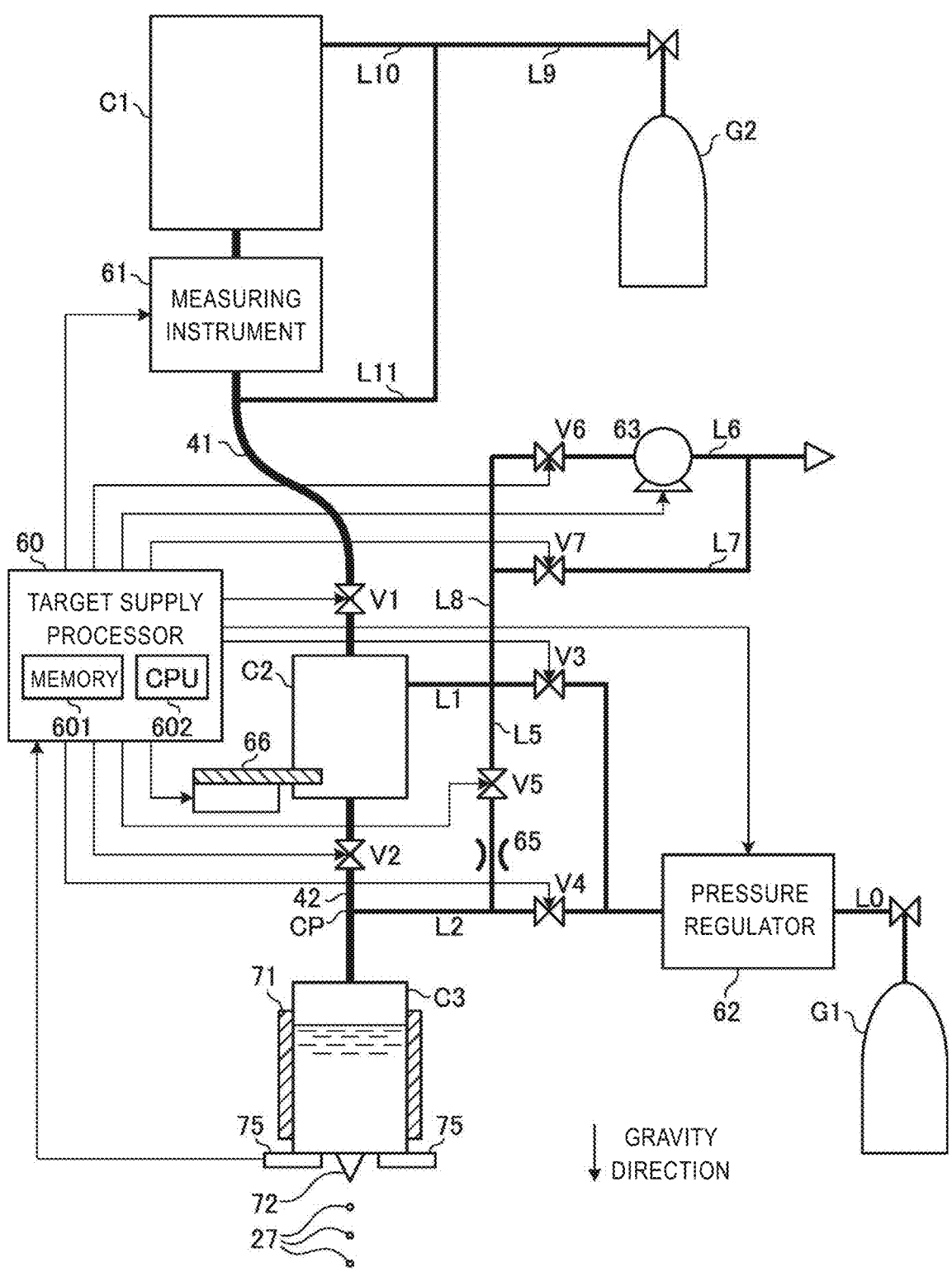

FIG. 14

| S11 | VALVES V1 TO V7 ARE CLOSED |
|---|---|
| S12 | OPEN VALVE V4 |
| S13 | ADJUST INSIDE OF PRESSURE TANK C3 TO HIGH PRESSURE |
| S14d | PROCEED TO NEXT WHEN PRESSURE TANK C3 BECOMES LIGHTER THAN FIRST WEIGHT |
| S21 | OPEN VALVE V1 |
| S22 | MEASURE TARGET SUBSTANCE |
| S23 | CLOSE VALVE V1 |
| S31 | ACTIVATE EXHAUST PUMP 63 AND OPEN VALVE V6 |
| S32 | CLOSE VALVE V6 AND STOP EXHAUST PUMP 63 |
| S41 | CLOSE VALVE V4 AND OPEN VALVE V3 |
| S42 | CLOSE VALVE V3 AND OPEN VALVE V4 |
| S51a | OPEN VALVE V5 |
| S52 | OPEN VALVE V2 |
| S53b | SET ADJUSTMENT MECHANISM 66 TO SECOND STATE |
| S54 | CLOSE VALVE V2 |
| S55a | CLOSE VALVE V5 |
| S56b | SET ADJUSTMENT MECHANISM 66 TO FIRST STATE |
| S61 | OPEN VALVE V7 |
| S62 | CLOSE VALVE V7 |
| S63 | RETURN TO S14d |

FIG. 16

| S11 | VALVES V1 TO V7 ARE CLOSED |
|---|---|
| S12 | OPEN VALVE V4 |
| S13 | ADJUST INSIDE OF PRESSURE TANK C3 TO HIGH PRESSURE |
| S14e | PROCEED TO NEXT WHEN AMOUNT OF OUTPUT TARGET SUBSTANCE BECOMES EQUAL TO OR GREATER THAN FIRST AMOUNT |
| S21 | OPEN VALVE V1 |
| S22 | MEASURE TARGET SUBSTANCE |
| S23 | CLOSE VALVE V1 |
| S31 | ACTIVATE EXHAUST PUMP 63 AND OPEN VALVE V6 |
| S32 | CLOSE VALVE V6 AND STOP EXHAUST PUMP 63 |
| S41 | CLOSE VALVE V4 AND OPEN VALVE V3 |
| S42 | CLOSE VALVE V3 AND OPEN VALVE V4 |
| S51a | OPEN VALVE V5 |
| S52 | OPEN VALVE V2 |
| S53b | SET ADJUSTMENT MECHANISM 66 TO SECOND STATE |
| S54 | CLOSE VALVE V2 |
| S55a | CLOSE VALVE V5 |
| S56b | SET ADJUSTMENT MECHANISM 66 TO FIRST STATE |
| S61 | OPEN VALVE V7 |
| S62 | CLOSE VALVE V7 |
| S63 | RETURN TO S14e |

TARGET SUPPLY DEVICE, TARGET SUPPLY METHOD, AND ELECTRONIC DEVICE MANUFACTURING METHOD

CROSS-REFERENCE TO RELATED APPLICATIONS

The application claims the benefit of Japanese Unexamined Patent Application No. 2020-088560, filed on May 21, 2020, the entire contents of which are hereby incorporated by reference.

BACKGROUND

1. Technical Field

The present disclosure relates to a target supply device, a target supply method, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulsed laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: Japanese Patent Application Publication No. 2015-053292
Patent Document 2: US Patent Application Publication No. 2006/0192154
Patent Document 3: US Patent Application Publication No. 2006/0192155
Patent Document 4: US Patent Application Publication No. 2014/0253716
Patent Document 5: Japanese Patent Application Publication No. H06-275535
Patent Document 6: US Patent Application Publication No. 2017/0350745

SUMMARY

A target supply device according to an aspect of the present disclosure includes a first container configured to contain a target substance, a second container configured to contain the target substance supplied from the first container, a first valve disposed between the first container and the second container, a first pipe connected to the second container and configured to supply pressurized gas to the second container, a third container configured to contain the target substance supplied from the second container, a second valve disposed between the second container and the third container, a second pipe connected to the third container and configured to supply pressurized gas to the third container, and a nozzle configured to output the target substance supplied from the third container.

A target supply method according to an aspect of the present disclosure, with an extreme ultraviolet light generation apparatus using a target supply device, includes: in a state that a second valve is closed, opening a first valve to supply a target substance from a first container to a second container and closing the first valve to supply pressurized gas to the second container, and then; opening the second valve to supply the target substance from the second container to a third container. Here, the target supply device includes the first container configured to contain the target substance, the second container configured to contain the target substance supplied from the first container, the first valve disposed between the first container and the second container, a first pipe connected to the second container and configured to supply pressurized gas to the second container, the third container configured to contain the target substance supplied from the second container, the second valve disposed between the second container and the third container, a second pipe connected to the third container and configured to supply pressurized gas to the third container, and a nozzle configured to output the target substance supplied from the third container.

An electronic device manufacturing method according to an aspect of the present disclosure includes generating extreme ultraviolet light by irradiating a target substance with pulsed laser light in an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a target supply device, and a laser light concentrating mirror configured to concentrate pulsed laser light on the target substance output to a predetermined region from the target supply device. The target supply device includes a first container configured to contain the target substance, a second container configured to contain the target substance supplied from the first container, a first valve disposed between the first container and the second container, a first pipe connected to the second container and configured to supply pressurized gas to the second container, a third container configured to contain the target substance supplied from the second container, a second valve disposed between the second container and the third container, a second pipe connected to the third container and configured to supply pressurized gas to the third container, and a nozzle configured to output the target substance supplied from the third container.

BRIEF DESCRIPTION OF THE DRAWINGS

Embodiments of the present disclosure will be described below merely as examples with reference to the accompanying drawings.

FIG. 4 illustrates operation procedure of the target supply device according to the first embodiment.

FIGS. 5A to 5D schematically illustrate opening and closing of valves V1 to V4 and pressure change at respective parts in some of the operation procedure illustrated in FIG. 4.

FIG. 7 illustrates operation procedure of the target supply device according to the second embodiment.

FIG. 10 illustrates operation procedure of the target supply device according to the third embodiment.

FIG. 12 illustrates operation procedure of the target supply device according to the fourth embodiment.

FIG. 13 schematically illustrates a configuration of a target supply device according to a fifth embodiment.

FIG. 14 illustrates operation procedure of the target supply device according to the fifth embodiment.

FIG. 16 illustrates operation procedure of the target supply device according to the sixth embodiment.

DESCRIPTION OF EMBODIMENTS

Figure 1:
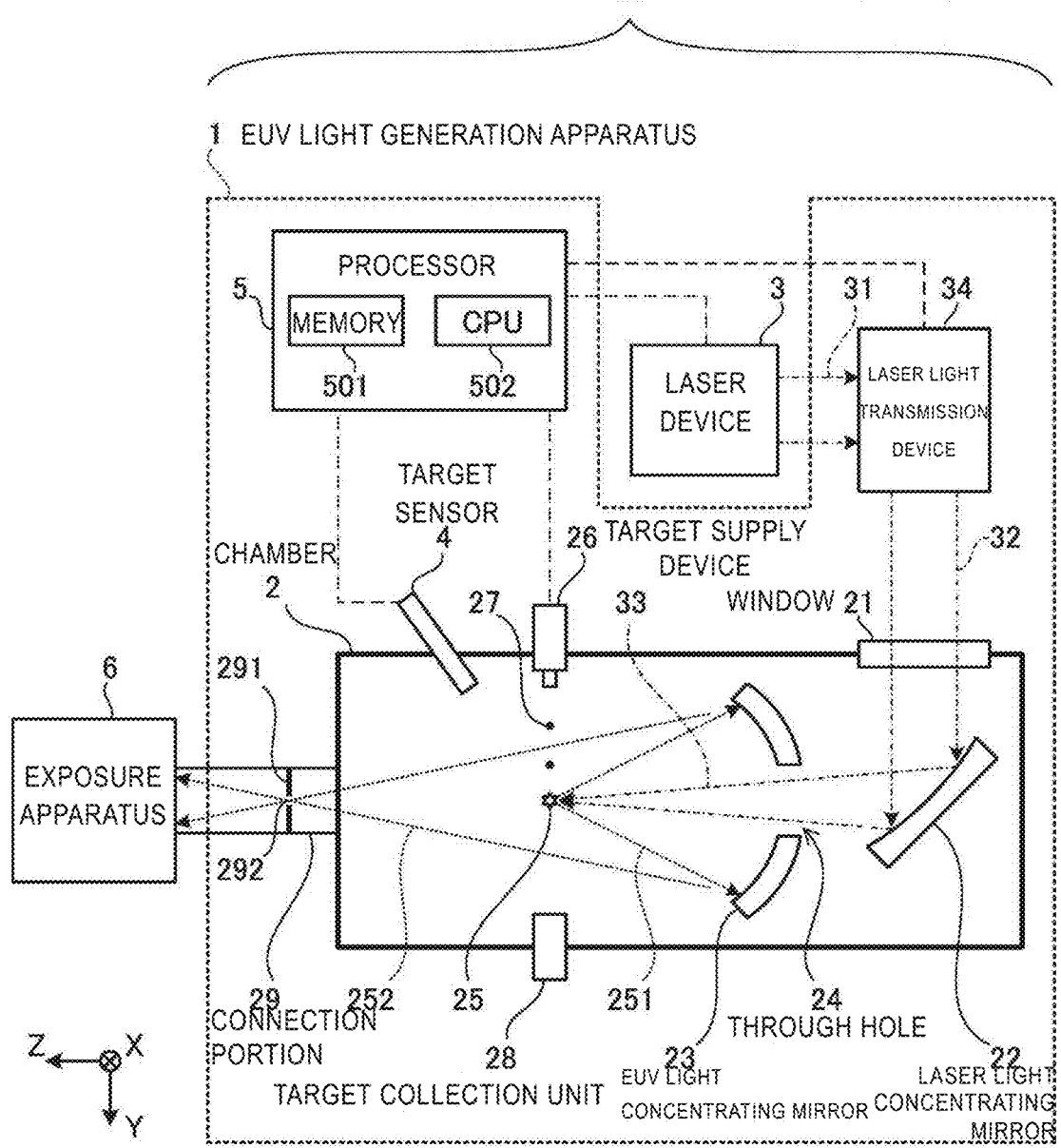
FIG. 1 schematically illustrates an exemplary configuration of an LPP EUV light generation system.

<Contents>
1. Overall description of EUV light generation system
   1.1 Configuration
   1.2 Operation
2. Comparative example
   2.1 Configuration
      2.1.1 Reservoir tank C1
      2.1.2 Load lock chamber C2
      2.1.3 Pressure tank C3
   2.2 Operation
      2.2.1 Supply to load lock chamber C2
      2.2.2 Supply to pressure tank C3
   2.3 Problem
3. Target supply device supplying pressurized gas to load lock chamber
   3.1 Configuration
   3.2 Operation
   3.3 Effect
4. Target supply device having bypass pipe
   4.1 Configuration
   4.2 Operation
   4.3 Effect
5. Target supply device including adjustment mechanism regulating movement of target substance
   5.1 Configuration
   5.2 Operation
   5.3 Effect
6. Target supply device replenishing target substance as measuring liquid level in pressure tank C3
   6.1 Configuration
   6.2 Operation
   6.3 Effect
7. Target supply device replenishing target substance as measuring weight of pressure tank C3
   7.1 Configuration
   7.2 Operation
   7.3 Effect
8. Target supply device replenishing target substance as measuring amount of output target substance
   8.1 Configuration
   8.2 Operation
   8.3 Effect
9. Target supply device stopping replenishment of target substance when liquid level in pressure tank C3 has become equal to or higher than second liquid level
   9.1 Configuration
   9.2 Operation
   9.3 Effect
10. Target supply device stopping replenishment of target substance for certain time period when liquid level in pressure tank C3 has become equal to or higher than second liquid level
    10.1 Operation
    10.2 Effect
11. Target supply device starting measurement for certain time period when liquid level in pressure tank C3 has become lower than second liquid level
    11.1 Operation
    11.2 Effect
12. Others Hereinafter, embodiments of the present disclosure will be described in detail with reference to the drawings. The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 1.1 Configuration

FIG. 1 schematically illustrates an exemplary configuration of an LPP EUV light generation system 11. An EUV light generation apparatus 1 is used with a laser device 3. In the present disclosure, a system including the EUV light generation apparatus 1 and the laser device 3 is referred to as an EUV light generation system 11. The EUV light generation apparatus 1 includes a chamber 2 and a target supply device 26. The chamber 2 is a sealable container. The target supply device 26 supplies a target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulsed laser light 32 emitted from the laser device 3 passes. An EUV light concentrating mirror 23 having a spheroidal reflection surface is disposed in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is disposed so that the first focal point is located in a plasma generation region 25 and the second focal point is located at an intermediate focal point 292. A through hole 24 is formed at the center of the EUV light concentrating mirror 23, and pulsed laser light 33 passes through the through hole 24.

The EUV light generation apparatus 1 includes a processor 5, a target sensor 4, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between an internal space of the chamber 2 and an internal space of the exposure apparatus 6. A wall 291 in which an aperture is formed is disposed in the connection portion 29. The wall 291 is arranged so that the aperture is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulsed laser light 31 emitted from the laser device 3 enters, via the laser light transmission device 34, the chamber 2 through the window 21 as the pulsed laser light 32. The pulsed laser light 32 travels along a laser light path in the chamber 2, is reflected by the laser light concentrating mirror 22, and is radiated to the target 27 as the pulsed laser light 33.

The target supply device 26 outputs the target 27 containing a target substance toward a plasma generation region 25 in the chamber 2. The target 27 is irradiated with the pulsed laser light 33. The target 27 irradiated with the pulsed laser light 33 is turned into plasma, and radiation light 251 is radiated from the plasma. The EUV light contained in the radiation light 251 is reflected by the EUV light concentrating mirror 23 with a higher reflectivity than light in other wavelength ranges. Reflection light 252 including the EUV light reflected by the EUV light concentrating mirror 23 is concentrated at the intermediate focal point 292 and emitted to the exposure apparatus 6. Here, one target 27 may be irradiated with a plurality of pulses included in the pulsed laser light 33.

The processor 5 controls the entire EUV light generation system 11. The processor 5 processes a detection result of the target sensor 4. Based on the detection result of the target sensor 4, the processor 5 controls timing at which the target 27 is output, an output direction of the target 27, and the like. Further, the processor 5 controls oscillation timing of the laser device 3, a travel direction of the pulsed laser light 32, the concentration position of the pulsed laser light 33, and the like. Such various kinds of control described above are merely exemplary, and other control may be added as necessary.

2. Comparative Example 2.1 Configuration

Figure 2:
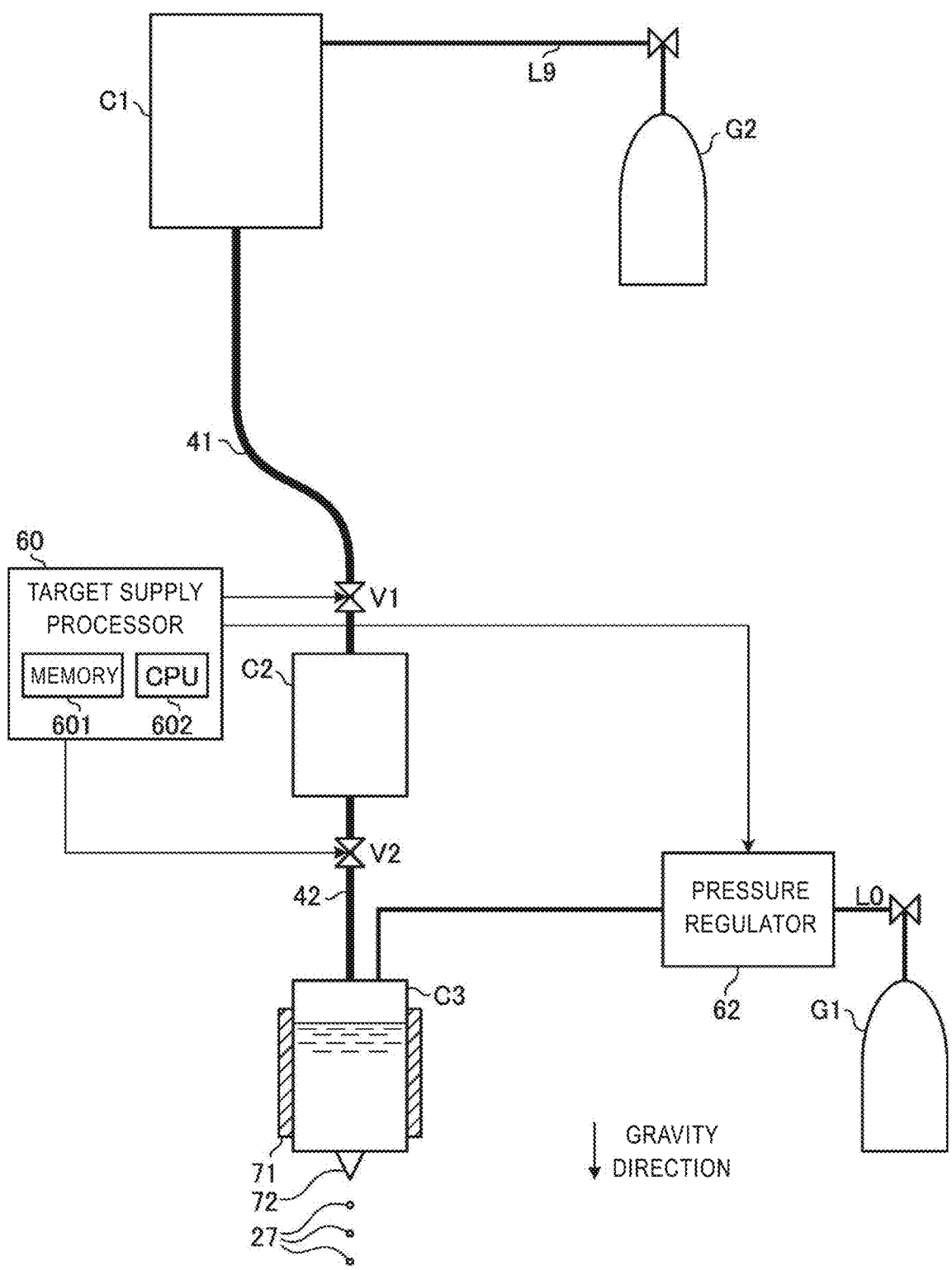
FIG. 2 schematically illustrates a configuration of a target supply device according to a comparative embodiment.

FIG. 2 schematically illustrates a target supply device 26 according to a comparative example. The comparative example of the present disclosure is an example recognized by the applicant as known only by the applicant, and is not a publicly known example admitted by the applicant. As illustrated in FIG. 2, the comparative example includes a reservoir tank C1, a load lock chamber C2, a pressure tank C3, and a target supply processor 60. The target supply processor 60 is a processing device including a memory 601 in which the control program is stored and a CPU 602 for executing the control program. The target supply processor 60 corresponds to the processor in the present disclosure. The target supply processor 60 is specifically configured or programmed to perform the various processes included in the present disclosure.

2.1.1 Reservoir Tank C1

The reservoir tank C1 is a container that contains a solid target substance such as tin. The solid target substance may be, for example, spherical particles having substantially the same size. The reservoir tank C1 corresponds to the first container in the present disclosure. The temperature in the reservoir tank C1 is lower than the melting point of the target substance. The reservoir tank C1 is connected to a gas cylinder G2 via a pipe L9. The gas cylinder G2 contains a rare gas such as an argon gas or a helium gas as a purge gas. The purge gas contained in the gas cylinder G2 is supplied to the inside of the reservoir tank C1. The pressure in the reservoir tank C1 is substantially equal to the atmospheric pressure.

The reservoir tank C1 is connected to the load lock chamber C2 via a supply pipe 41. A valve V1 is disposed at the supply pipe 41. The valve V1 corresponds to the first valve in the present disclosure.

2.1.2 Load Lock Chamber C2

The load lock chamber C2 is a container to contain the target substance supplied from the reservoir tank C1. The load lock chamber C2 corresponds to the second container in the present disclosure. The temperature in the load lock chamber C2 is lower than the melting point of the target substance.

The load lock chamber C2 is connected to the pressure tank C3 via a supply pipe 42. A valve V2 is disposed at the supply pipe 42. The valve V2 corresponds to the second valve in the present disclosure.

2.1.3 Pressure Tank C3

The pressure tank C3 contains the target substance supplied from the load lock chamber C2. The pressure tank C3 corresponds to the third container in the present disclosure. The pressure tank C3 is connected to the gas cylinder G1 via a pressurized gas pipe L0. The gas cylinder G1 contains a high-pressure rare gas such as an argon gas or a helium gas as a pressurized gas. A pressure regulator 62 is disposed at the pressurized gas pipe L0. The target supply processor 60 controls the pressure regulator 62 based on an output of a pressure meter (not illustrated), so that the pressure in the pressure tank C3 is regulated to a predetermined pressure higher than the atmospheric pressure.

A heater 71 and a nozzle 72 are disposed at the pressure tank C3.

The heater 71 is connected to a power source (not illustrated), and heats the inside of the pressure tank C3 to a predetermined temperature higher than the melting point of the target substance. The temperature in the pressure tank C3 is controlled by controlling the power supply based on the output of a temperature sensor (not illustrated) disposed at the pressure tank C3.

The nozzle 72 is disposed at a lower end portion of the pressure tank C3 in the gravity direction. The tip of the nozzle 72 is opened to the inside of the chamber 2 (see FIG. 1). The target substance melted by the heater 71 is output from the opening at the tip of the nozzle 72 owing to the pressure difference between the pressurized gas supplied from the pressure regulator 62 and the pressure in the chamber 2. When vibration is applied to the nozzle 72 by a piezoelectric element (not illustrated), the jet-like target substance output from the nozzle 72 is separated into droplets to form the target 27.

2.2 Operation

In the comparative example, the target substance in the reservoir tank C1 is supplied to the pressure tank C3 via the load lock chamber C2 in the following manner.

2.2.1 Supply to Load Lock Chamber C2

A target supply processor 60 opens the valve V1 to supply a portion of a solid target substance contained in the reservoir tank C1 to the load lock chamber C2. At this time, in order to maintain the inside of the pressure tank C3 at a high pressure, the valve V2 is closed. The target substance is moved from the reservoir tank C1 to the load lock chamber C2 by gravity. When a desired amount of the target substance is moved from the reservoir tank C1 to the load lock chamber C2, the target supply processor 60 closes the valve V1.

2.2.2 Supply to Pressure Tank C3

Next, the target supply processor 60 opens the valve V2 to supply the solid target substance contained in the load lock chamber C2 to the pressure tank C3. The target substance is moved from the load lock chamber C2 to the pressure tank C3 by gravity. The target substance supplied to the pressure tank C3 melts and mixes with the target substance contained and melted in the pressure tank C3. The heater 71 suppresses a decrease in the internal temperature of the pressure tank C3.

When the valve V2 is opened, a portion of the gas in the pressure tank C3 is moved to the load lock chamber C2, and the pressure in the pressure tank C3 is temporarily decreased. If the valve V1 is closed before the valve V2 is opened, the high-pressure gas in the pressure tank C3 can be prevented from flowing from the valve V1 to the reservoir tank C1. Further, the pressurized gas in the gas cylinder G1 is supplied to the pressure tank C3 via the pressure regulator 62, whereby the pressure in the pressure tank C3 is recovered.

2.3 Problem

According to the comparative example, the target substance contained in the reservoir tank C1 having a substantially atmospheric pressure can be supplied into the pressure tank C3 having a high pressure. Even if the target substance in the pressure tank C3 is consumed, the target substance can be replenished without replacing the pressure tank C3, so that the downtime of the EUV light generation apparatus 1 can be reduced.

However, when the valve V2 is opened, the pressure in the pressure tank C3 is temporarily decreased. Since the speed of the target 27 depends on the pressure difference between the inside of the pressure tank C3 and the inside of the chamber 2, the speed of the target 27 changes when the pressure in the pressure tank C3 changes. When the speed of the target 27 changes, it becomes difficult to accurately irradiate the target 27 with the pulsed laser light 33 (see FIG. 1) or the position of the target 27 at the time of irradiation with the pulsed laser light 33 fluctuates, so that the quality of the EUV light fluctuates.

In the embodiments described below, in order to suppress a pressure change in the pressure tank C3 when the valve V2 is opened, the pressurized gas is supplied to the load lock chamber C2 in advance.

Figure 3:
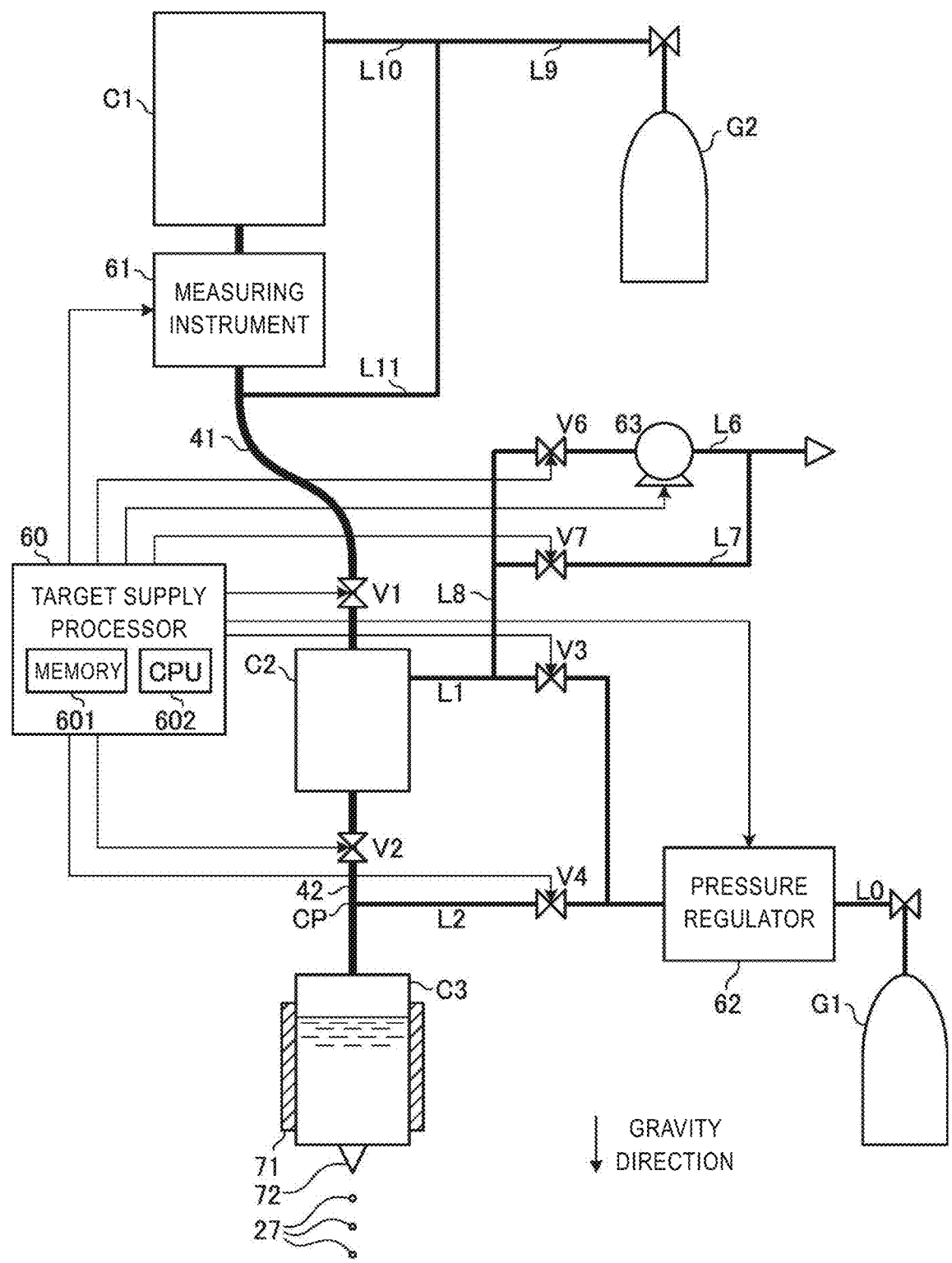
FIG. 3 schematically illustrates a configuration of a target supply device according to a first embodiment.

3. Target Supply Device Supplying Pressurized Gas to Load Lock Chamber 3.1 Configuration FIG. 3 schematically illustrates a configuration of a target supply device 261 according to a first embodiment. The target supply device 261 includes pipes L1, L2, L6, L7, L8, L10, and L11, valves V3, V4, V6, and V7, a measuring instrument 61, and an exhaust pump 63 in addition to the configuration of the comparative example.

The pressurized gas pipe L0 is branched into a pipe L1 and a pipe L2.

The pipe L1 is connected to the load lock chamber C2, and is configured to supply the pressurized gas to the load lock chamber C2. The pipe L1 corresponds to the first pipe in the present disclosure.

The valve V3 is disposed at the pipe L1. The valve V3 corresponds to the third valve in the present disclosure.

The pipe L2 is connected to the pressure tank C3, and is configured to supply pressurized gas to the pressure tank C3. The pipe L2 corresponds to the second pipe in the present disclosure. The valve V4 is disposed at the pipe L2. The valve V4 corresponds to the fourth valve in the present disclosure. For example, when the pipe L2 is directly connected to the pressure tank C3 in the same manner as the pressurized gas pipe L0 illustrated in FIG. 2, a heat insulating mechanism (not illustrated) may be provided between the pressure tank C3 and the valve V2, and a heat insulating mechanism (not illustrated) may also be provided between the pressure tank C3 and the valve V4. Alternatively, as illustrated in FIG. 3, the pipe L2 may be connected to the pressure tank C3 by being connected to the supply pipe 42 between the pressure tank C3 and the valve V2 at the connection position CP.

The pipe L8 for exhaust is connected to a pipe L1 between the load lock chamber C2 and the valve V3. The pipe L8 is branched into the pipe L6 and the pipe L7. The valve V6 and the exhaust pump 63 are disposed at the pipe L6. The valve V7 is disposed at the pipe L7.

The exhaust pump 63 is configured to forcibly exhaust the gas in the load lock chamber C2 so that the pressure in the load lock chamber C2 can be lower than the atmospheric pressure.

The measuring instrument 61 measures the solid target substance supplied from the reservoir tank C1. Measuring the solid target substance includes counting the number of particles of the solid target substance. After a predetermined amount of the solid target substance is measured, the measured solid target substance is allowed to pass toward the load lock chamber C2. After the predetermined amount of the solid target substance passes, the measuring instrument 61 stops passing of the solid target substance.

The purge gas contained in the gas cylinder G2 is not limited to a rare gas and may be dry air as long as it is a gas that does not easily react with the solid target substance.

The pipe L9 is branched into a pipe L10 and a pipe L11. The pipe L10 is connected to the reservoir tank C1. The pipe L11 is connected to the supply pipe 41 between the measuring instrument 61 and the valve V1.

3.2 Operation

FIG. 4 illustrates operation procedure of the target supply device 261 according to the first embodiment. FIGS. 5A to 5D schematically illustrate opening and closing of the valves V1 to V4 and pressure change at respective parts in some of the operation procedure illustrated in FIG. 4. In the first embodiment, after the target supply device 261 starts supplying the target 27 and the target substance is consumed, the pressure tank C3 is replenished with the target substance in the reservoir tank C1 via the load lock chamber C2.

In S11, the operation starts from a state in which all of the valves V1 to V4, V6, and V7 are closed. The heater 71 heats the inside of the pressure tank C3 to a predetermined temperature higher than the melting point of the target substance.

In S12, the target supply processor 60 opens the valve V4. Thus, the pressurized gas contained in the gas cylinder G1 is supplied to the pressure tank C3 (see FIG. 5A).

In S13, the target supply processor 60 controls the pressure regulator 62 to adjust the pressure in the pressure tank C3 to a predetermined pressure higher than the atmospheric pressure. Thus, the target supply device 261 starts supply of the target 27, and consumption of the target substance is started.

In S14, the target supply processor 60 waits until the target substance is consumed after a certain time period elapses, and proceeds to the next step after the certain time period has elapsed.

In S21, the target supply processor 60 opens the valve V1.

In S22, the target supply processor 60 controls the measuring instrument 61 so that the measuring instrument 61 measures and allows a predetermined amount of the solid target substance to pass therethrough, and then the measuring instrument 61 stops passing of the target substance. Thus, the target substance is supplied to the load lock chamber C2 (see FIG. 5B). A portion of the purge gas in the reservoir tank C1 also flows into the load lock chamber C2.

In S23, the target supply processor 60 closes the valve V1. Thus, the valve V1 is opened before the measuring instrument 61 allows passing of the solid target substance, and is closed when the predetermined amount of the solid target substance having passed through the measuring instrument 61 passes through the valve V1.

In S31, the target supply processor 60 activates the exhaust pump 63 and then opens the valve V6.

In S32, the target supply processor 60 closes the valve V6 and then stops the exhaust pump 63. The purge gas flowing into the load lock chamber C2 from the reservoir tank C1 is thereby exhausted to the outside.

In S41, the target supply processor 60 closes the valve V4 and then opens the valve V3. By opening the valve V3, the pressurized gas is supplied to the load lock chamber C2 (see FIG. 5C). The pressure in the load lock chamber C2 is substantially equal to the pressure in the pressure tank C3.

In S42, the target supply processor 60 closes the valve V3 and then opens the valve V4.

In S52, the target supply processor 60 opens the valve V2. Thus, the solid target substance in the load lock chamber C2 is supplied into the pressure tank C3 (see FIG. 5D). Since the pressure in the load lock chamber C2 is substantially equal to the pressure in the pressure tank C3, the pressure fluctuation in the pressure tank C3 when the valve V2 is opened is small.

In S54, the target supply processor 60 closes the valve V2.

In S61, the target supply processor 60 opens the valve V7. As a result, the pressure in the load lock chamber C2 becomes substantially equal to the atmospheric pressure.

In S62, the target supply processor 60 closes the valve V7.

In S63, the target supply processor 60 returns to the process of S14.

3.3 Effect

According to the first embodiment, the target supply device 261 includes the reservoir tank C1, the load lock chamber C2, and the pressure tank C3. The valve V1 is arranged between the reservoir tank C1 and the load lock chamber C2, and the valve V2 is arranged between the load lock chamber C2 and the pressure tank C3.

Since the pipe L1 is connected to the load lock chamber C2 to supply the pressurized gas and the pipe L2 is connected to the pressure tank C3 to supply the pressurized gas, the pressurized gas can be individually supplied to the load lock chamber C2 and the pressure tank C3. If pressurized gas is supplied to both the load lock chamber C2 and the pressure tank C3, the pressure fluctuation in the pressure tank C3 when the valve V2 is opened can be reduced. Therefore, the change of the speed of the target 27 output from the nozzle 72 is reduced. This makes it possible to accurately irradiate the target 27 with the pulsed laser light 33 (see FIG. 1). In addition, fluctuation in position of the target 27 during irradiation with the pulsed laser light 33 is reduced. Therefore, the quality of the EUV light is stabilized.

According to the first embodiment, the target supply device 261 further includes the valve V3 disposed at the pipe L1. In the first embodiment, in a state where the valve V2 is closed (S11, FIG. 5A), the valve V1 is opened (S21), and the target substance is supplied from the reservoir tank C1 to the load lock chamber C2 (S22, FIG. 5B). Since the valve V2 is closed, the target substance can be moved from the reservoir tank C1 to the load lock chamber C2 while maintaining the pressure in the pressure tank C3.

Further, in the first embodiment, the valve V1 is closed (S23), and the valve V3 is opened to supply the pressurized gas to the load lock chamber C2 (S41, FIG. 5C). Thereafter, the valve V2 is opened to supply the target substance from the load lock chamber C2 to the pressure tank C3 (S52, FIG. 5D). Since the valve V2 is opened after the pressurized gas is supplied to the load lock chamber C2, the pressure fluctuation in the pressure tank C3 can be reduced.

According to the first embodiment, the target supply device 261 further includes the pressurized gas pipe L0, which is used commonly, that supplies the pressurized gas to the pipe L1 and the pipe L2. Since the pressurized gas is supplied from the common pressurized gas pipe L0 to both the pipe L1 and the pipe L2, the difference between the pressure in the pressure tank C3 and the pressure in the load lock chamber C2 when the pressurized gas is supplied to the load lock chamber C2 can be reduced.

Further, according to the first embodiment, the target supply device 261 includes the valve V3 disposed at the pipe L1 between the load lock chamber C2 and the pressurized gas pipe L0, and the valve V4 disposed at the pipe L2 between the pressure tank C3 and the pressurized gas pipe L0. In the first embodiment, in a state where the valve V2 is closed (S11, FIG. 5A), the valve V1 is opened (S21), and the target substance is supplied from the reservoir tank C1 to the load lock chamber C2 (S22, FIG. 5B). Further, in the first embodiment, the valve V1 and the valve V4 are closed (S23, S41), and then the valve V3 is opened to supply the pressurized gas to the load lock chamber C2 (S41, FIG. 5C). Thereafter, the valve V2 is opened to supply the target substance from the load lock chamber C2 to the pressure tank C3 (S52, FIG. 5D). In a case where the pipe L1 and the pipe L2 are connected to the common pressurized gas pipe L0, when the valve V3 is opened while the valve V4 is opened, the gas in the pressure tank C3 passes through the valve V4, further passes through the valve V3, and flows into the load lock chamber C2, so that the pressure in the pressure tank C3 may fluctuate. By keeping the valve V4 closed, the pressure in the pressure tank C3 can be prevented from fluctuating when the valve V3 is opened.

The pressurized gas pipe L0, the gas cylinder G1, and the pressure regulator 62 may not be common to the pipe L1 and the pipe L2, and may be separately provided. In this case, the valve V3 may be opened while the valve V4 is opened in S41.

According to the first embodiment, the target supply device 261 includes the valve V3 disposed at the pipe L1 and the exhaust pump 63 that exhausts the gas in the load lock chamber C2. In the first embodiment, in a state where the valve V2 is closed (S11, FIG. 5A), the valve V1 is opened (S21), and the target substance is supplied from the reservoir tank C1 to the load lock chamber C2 (S22, FIG. 5B). Further, in the first embodiment, the valve V1 is closed (S23), and the gas in the load lock chamber C2 is exhausted by the exhaust pump 63 (S31). Thereafter, the valve V3 is opened to supply the pressurized gas to the load lock chamber C2 (S41, FIG. 5C). Thereafter, the valve V2 is opened to supply the target substance from the load lock chamber C2 to the pressure tank C3 (S52, FIG. 5D). Accordingly, the purge gas flowing into the load lock chamber C2 from the reservoir tank C1 is exhausted to the outside by the exhaust pump 63. Therefore, the choice of the purge gas supplied from the gas cylinder G2 to the reservoir tank C1 is widened. That is, a rare gas may be selected as the purge gas in consideration of the fact that a portion of the purge gas flows to the pressure tank C3, or dry air may be selected as the purge gas by assuming that the amount of the purge gas flowing to the pressure tank C3 is sufficiently small.

According to the first embodiment, the target supply device 261 further includes the measuring instrument 61. The measuring instrument 61 is disposed between the reservoir tank C1 and the valve V1, measures the target substance supplied from the reservoir tank C1, allows passing of the predetermined amount of the target substance, and then stops passing of the target substance. The valve V1 is opened (S21) before the measuring instrument 61 allows passing of the target substance, and is closed (S23) after the predetermined amount of the target substance having passed through the measuring instrument 61 passes through the valve V1. Accordingly, since the valve V1 is no longer required to perform the function of stopping the flow of the target substance, the valve V1 can better exert the function of regulating the movement of the gas between the reservoir tank C1 and the load lock chamber C2. In addition, since the valve V1 is closed after the predetermined amount of the target substance having passed through the measuring instrument 61 passes through the valve V1, the valve V1 may not bite the target substance when the valve V1 is closed.

According to the first embodiment, the temperature in the reservoir tank C1 and the temperature in the load lock chamber C2 are lower than the melting point of the target substance, and the temperature in the pressure tank C3 is higher than the melting point of the target substance. Accordingly, handling of the target substance in the reservoir tank C1 and in the load lock chamber C2 is facilitated. Even if the pressure in the load lock chamber C2 and the pressure in the pressure tank C3 are substantially equalized, the target substance can be smoothly supplied from the load lock chamber C2 to the pressure tank C3.

According to the first embodiment, the target supply device 261 further includes the supply pipe 42, at which the valve V2 is disposed, disposed between the load lock chamber C2 and the pressure tank C3. In the first embodiment, the pipe L2 is connected to the pressure tank C3 by being connected to the supply pipe 42 between the valve V2 and the pressure tank C3 at the connection position CP. In this case, a heat insulating mechanism (not illustrated) can be provided between the connection position CP and the pressure tank C3 having high temperature. The pipe L2 may not be provided with a thermal insulation mechanism, or a material that emphasizes performance other than thermal insulation performance may be selected.

4. Target Supply Device Having Bypass Pipe

In the first embodiment, the valve V2 is opened after the pressure in the load lock chamber C2 and the pressure in the pressure tank C3 are substantially equalized by the pipe L1 that supplies the pressurized gas to the load lock chamber C2. However, there is a case that the pressure in the load lock chamber C2 and the pressure in the pressure tank C3 are not completely equalized when the valve V2 is opened. For example, when temperature in the load lock chamber C2 changes, the pressure changes according to the Boyle-Charles' law, and a slight difference may occur between the pressure in the load lock chamber C2 and the pressure in the pressure tank C3.

In a second embodiment described below, a bypass pipe L5 is provided so that the pressure in the load lock chamber C2 and the pressure in the pressure tank C3 can be substantially equalized.

4.1 Configuration

Figure 6:
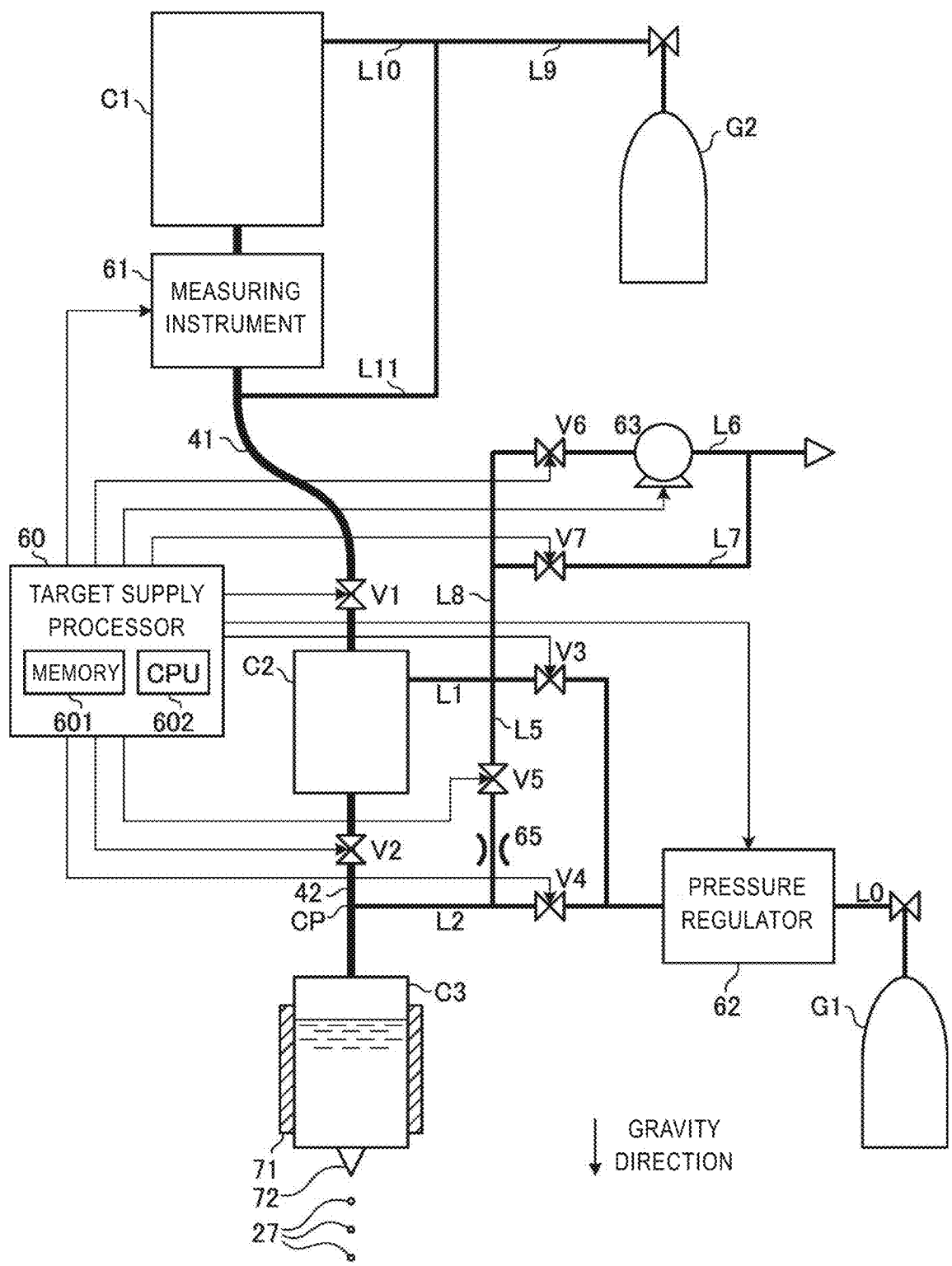
FIG. 6 schematically illustrates a configuration of a target supply device according to a second embodiment.

FIG. 6 schematically illustrates a configuration of a target supply device 262 according to the second embodiment.

The target supply device 262 includes the bypass pipe L5, a valve V5, and a choke unit 65.

The valve V5 corresponds to the fifth valve in the present disclosure.

The bypass pipe L5 connects the load lock chamber C2 and the pressure tank C3 by bypassing the valve V2. For example, the bypass pipe L5 is connected between a position between the load lock chamber C2 and the valve V3 in the pipe L1 and a position between the connection position CP and the valve V4 in the pipe L2.

The valve V5 and the choke unit 65 are disposed at the bypass pipe L5. The choke unit 65 includes, for example, an orifice or a venturi tube having a pressure loss larger than that of the valve V5 in an open state, and suppresses the flow rate of the bypass pipe L5. The choke unit 65 corresponds to the flow rate suppressing unit in the present disclosure.

In other respects, the configuration of the second embodiment is similar to that of the first embodiment.

4.2 Operation

FIG. 7 illustrates operation procedure of the target supply device 262 according to the second embodiment. The processes of S11 to S42 is similar to the corresponding processes in the first embodiment. However, the valve V5 is also closed in S11. The target supply device 262 according to the second embodiment operates as follows after closing the valve V3 and opening the valve V4 in S42.

In S51a, the target supply processor 60 opens the valve V5. Thus, in accordance with the difference between the pressure in the load lock chamber C2 and the pressure in the pressure tank C3, the pressurized gas flows slowly from the high-pressure side to the low-pressure side. Then, the pressure in the load lock chamber C2 and the pressure in the pressure tank C3 are substantially equalized.

The target supply processor 60 opens the valve V2 in S52 and closes the valve V2 in S54. This is similar to the first embodiment.

In S55a, the target supply processor 60 closes the valve V5. The subsequent processes of S61 to S63 are similar to the corresponding processes in the first embodiment.

4.3 Effect

According to the second embodiment, the target supply device 262 further includes the bypass pipe L5 that bypasses the valve V2 and connects the load lock chamber C2 and the pressure tank C3. The valve V5 and the choke unit 65 for suppressing the flow rate of the bypass pipe L5 are disposed at the bypass pipe L5. When there is a pressure difference between the inside of the load lock chamber C2 and the inside of the pressure tank C3, if the valve V2 is opened in S52, there is a possibility that the pressure in the pressure tank C3 changes abruptly. According to the second embodiment, since the bypass pipe L5 including the choke unit 65 bypasses the valve V2, the pressure in the load lock chamber C2 and the pressure in the pressure tank C3 can be substantially equalized, and even when the pressure in the pressure tank C3 changes, the change can be made gentle. Thus, since the change of the speed of the target 27 becomes gentle, the control of the irradiation timing of the pulsed laser light 33 (see FIG. 1) can catch up with the change in the speed of the target 27.

According to the second embodiment, the target supply device 262 includes the valve V3 disposed at the pipe L1. In the second embodiment, in a state where the valve V2 is closed (S11, FIG. 5A), the valve V1 is opened (S21), and the target substance is supplied from the reservoir tank C1 to the load lock chamber C2 (S22, FIG. 5B). Furthermore, in the second embodiment, the valve V1 is closed (S23), and the valve V3 is opened to supply the pressurized gas to the load lock chamber C2 (S41, FIG. 5C). Here, by opening the valve V5 (S51a), the pressure in the load lock chamber C2 and the pressure in the pressure tank C3 are substantially equalized. Thereafter, since the valve V2 is opened (S52, FIG. 5D), the pressure fluctuation in the pressure tank C3 can be reduced.

In other respects, the operation of the second embodiment is similar to that of the first embodiment.

5. Target Supply Device Including Adjustment Mechanism Regulating Movement of Target Substance In a third embodiment described below, an adjustment mechanism 66 is provided to prevent the valve V2 from being damaged by the solid target substance.

5.1 Configuration

Figure 8:
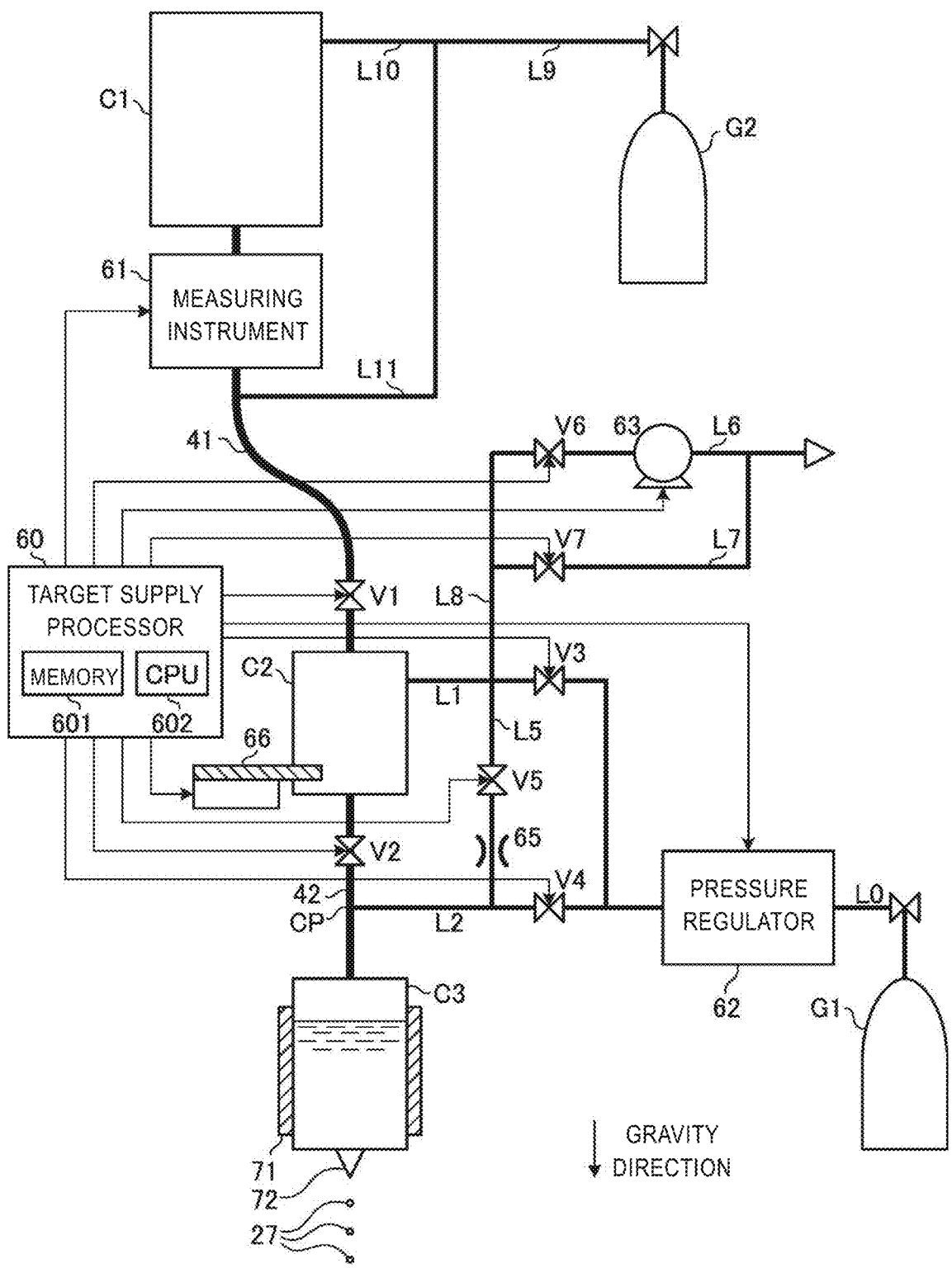
FIG. 8 schematically illustrates a configuration of a target supply device according to a third embodiment.

FIG. 8 schematically illustrates a configuration of a target supply device 263 according to the third embodiment.

The target supply device 263 includes the adjustment mechanism 66 for preventing the target substance supplied to the load lock chamber C2 from reaching the valve V2.

Figure 9A:
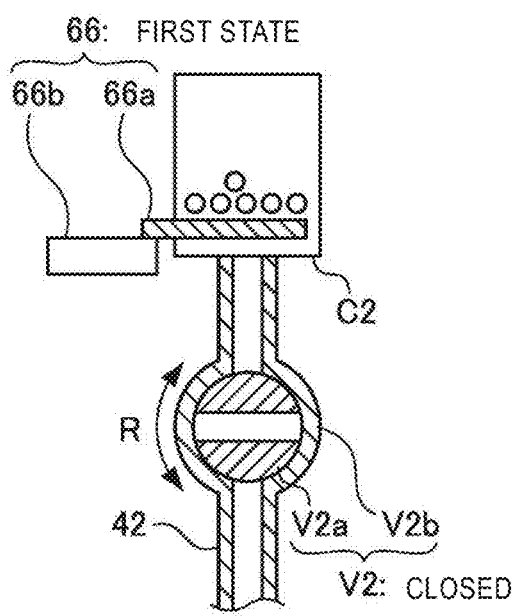
FIGS. 9A and 9B illustrate a configuration and operation of an adjustment mechanism and a valve V2.
Figure 9B:
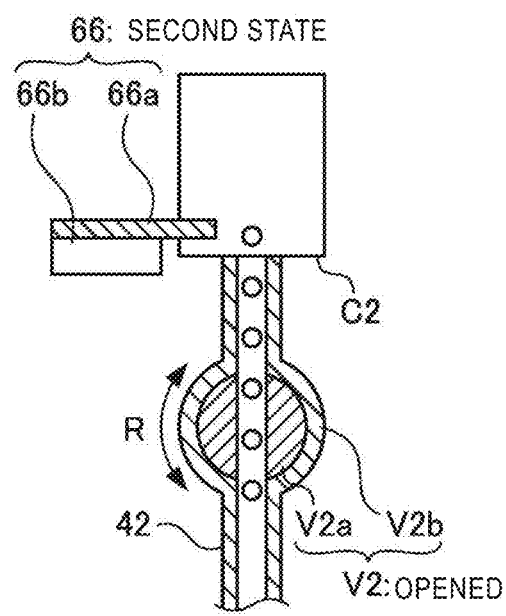

FIGS. 9A and 9B illustrate a configuration and operation of the adjustment mechanism 66 and the valve V2.

The adjustment mechanism 66 includes a receiving plate 66a and an actuator 66b. The receiving plate 66a is located near the lower end of the load lock chamber C2. The actuator 66b is configured to switch the adjustment mechanism 66 between a first state illustrated in FIG. 9A and a second state illustrated in FIG. 9B by moving the receiving plate 66a.

In the first state, the receiving plate 66a is disposed to block a connecting portion from the load lock chamber C2 to the supply pipe 42. Thus, the movement of the solid target substance toward the valve V2 is suppressed.

In the second state, the receiving plate 66a is disposed at a position away from the connecting portion between the load lock chamber C2 and the supply pipe 42. This allows the solid target substance to move toward the valve V2. The second state may further include a state in which the actuator 66b vibrates or tilts the receiving plate 66a so that the solid target substance is moved from the receiving plate 66a toward the valve V2.

The adjustment mechanism 66 is normally set in the first state, and is temporarily set in the second state when the solid target substance is moved toward the valve V2.

The valve V2 includes, for example, a ball valve including a ball portion V2a and a body portion V2b. By rotating the ball portion V2a inside the body portion V2b in the direction of the arrow R, switching is performed between the closed state illustrated in FIG. 9A and the open state illustrated in FIG. 9B.

In other respects, the configuration of the third embodiment is similar to that of the second embodiment.

Alternatively, in the third embodiment, similarly to the first embodiment, a configuration not including the bypass pipe L5 may be adopted.

5.2 Operation

FIG. 10 illustrates operation procedure of the target supply device 263 according to the third embodiment. The processes of S11 to S52 are similar to the corresponding processes in the second embodiment. However, when the target substance is supplied to the load lock chamber C2 in S22, the adjustment mechanism 66 is in the first state, and the solid target substance is prevented from reaching the valve V2 (see FIG. 9A).

The target supply device 263 according to the third embodiment operates as follows after the valve V2 is opened in S52.

In S53b, the target supply processor 60 sets the adjustment mechanism 66 from the first state to the second state (see FIG. 9B). Since the valve V2 is opened in S52, the solid target substance passes through the valve V2 without being blocked by the valve V2 and is supplied to the pressure tank C3.

The target supply processor 60 closes the valve V2 in S54 and closes the valve V5 in S55a. This is similar to the second embodiment. By closing the valve V2 after all the solid target substance contained in the load lock chamber C2 passes through the valve V2, it is possible to prevent the valve V2 from biting the solid target substance when the valve V2 is closed.

In S56b, the target supply processor 60 sets the adjustment mechanism 66 from the second state to the first state.

The subsequent processes of S61 to S63 are similar to the corresponding processes in the second embodiment.

5.3 Effect

According to the third embodiment, the target supply device 263 further includes the adjustment mechanism 66. The adjustment mechanism 66 is switched between the first state and the second state. The first state illustrated in FIG. 9A is a state in which the target substance supplied to the load lock chamber C2 is prevented from reaching the valve V2. The second state illustrated in FIG. 9B is a state in which the target substance supplied to the load lock chamber C2 is allowed to reach the valve V2. Accordingly, the adjustment mechanism 66 can exert a function of receiving the target substance and regulating passing of the target substance.

Since the valve V2 does not need to receive the target substance, the valve V2 can better exert the function of regulating the movement of gas between the load lock chamber C2 and the pressure tank C3.

According to the third embodiment, the valve V2 includes the ball valve. In the third embodiment, when the valve V2 is closed and the adjustment mechanism 66 is in the first state, the valve V1 is opened (S21) and the target substance is supplied to the load lock chamber C2. On the other hand, when the valve V1 is closed and the valve V2 is opened, the adjustment mechanism 66 is set to the second state (S53b). Accordingly, since the adjustment mechanism 66 is in the first state when the target substance is supplied to the load lock chamber C2, it is possible to prevent the surface of the ball portion V2a of the ball valve from being damaged by the target substance coming into contact with the ball portion V2a. Since the surface of the ball portion V2a functions as a sealing surface of the ball valve, decrease in lifetime of the ball valve is suppressed by protecting the surface of the ball portion V2a. In other respects, the effect of the third embodiment is similar to that of the second embodiment.

6. Target Supply Device Replenishing Target Substance as Measuring Liquid Level in Pressure Tank C3

In a fourth embodiment described below, the target substance is replenished when the liquid level of the target substance in the pressure tank C3 has become lower than the first liquid level.

6.1 Configuration

Figure 11:
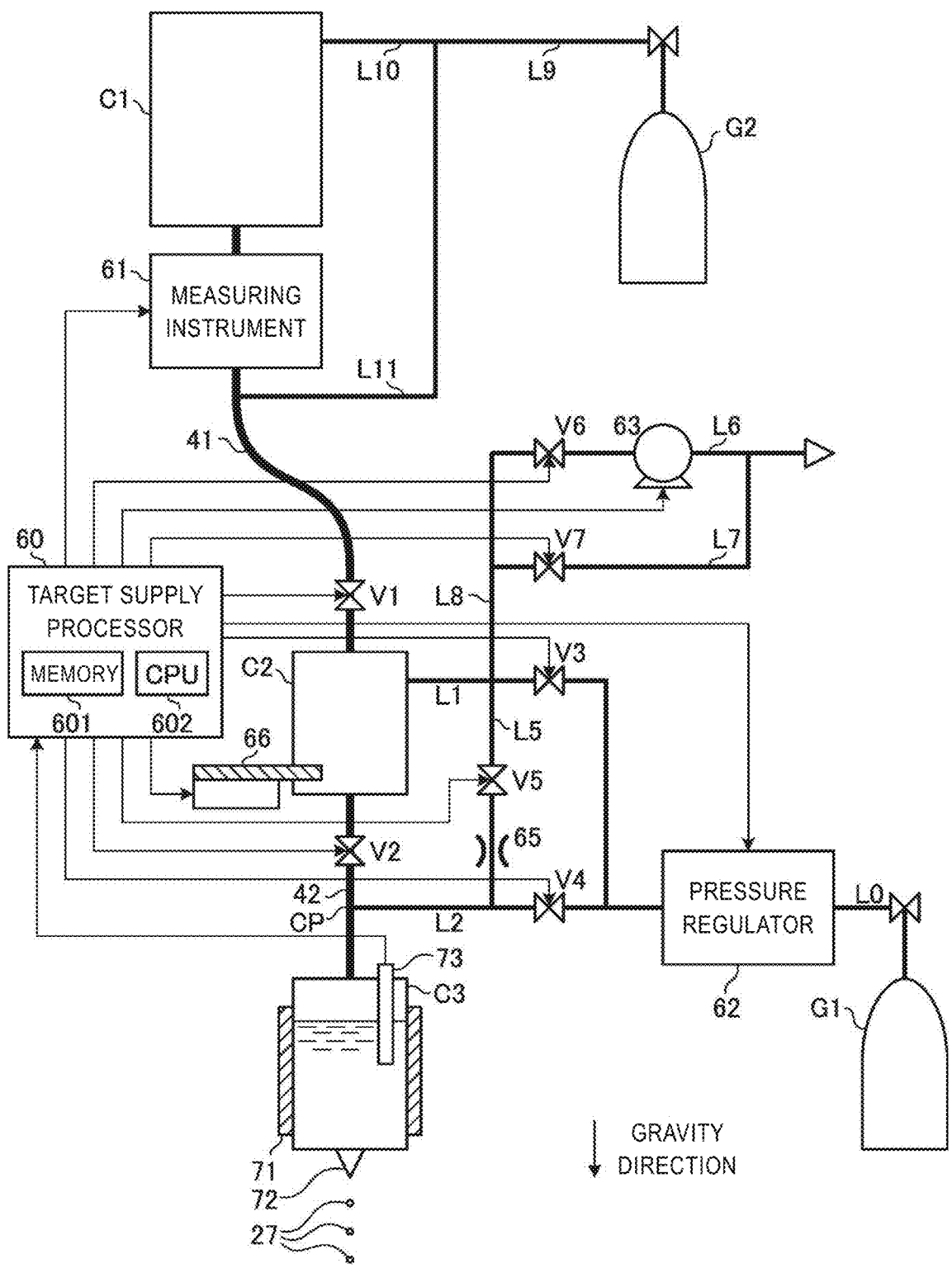
FIG. 11 schematically illustrates a configuration of a target supply device according to a fourth embodiment.

FIG. 11 schematically illustrates a configuration of a target supply device 264 according to the fourth embodiment.

The target supply device 264 includes a liquid level sensor 73 that detects the amount of the target substance in the pressure tank. The liquid level sensor 73 may be, for example, a sensor for detecting the presence or absence of contact with the target substance. When the tip of the liquid level sensor 73 is in contact with the target substance, it can be detected that the liquid level of the target substance is higher than or equal to the first liquid level, that is, the amount of the target substance is equal to or greater than a first value. When the tip of the liquid level sensor 73 is not in contact with the target substance, it can be detected that the liquid level of the target substance is lower than the first liquid level, that is, the amount of the target substance is smaller than the first value.

In other respects, the configuration of the fourth embodiment is similar to that of the third embodiment.

Alternatively, in the fourth embodiment, similarly to the first embodiment, a configuration not including the bypass pipe L5 may be adopted.

Alternatively, in the fourth embodiment, similarly to the second embodiment, a configuration not including the adjustment mechanism 66 may be adopted.

6.2 Operation

FIG. 12 illustrates operation procedure of the target supply device 264 according to the fourth embodiment. The processes of S11 to S13 and from S21 to S63 are similar to the corresponding processes in the third embodiment. In the fourth embodiment, the process of S14c is performed instead of S14.

In S14c, the target supply processor 60 waits until the liquid level in the pressure tank C3 becomes lower than the first liquid level, and proceeds to the next step when the liquid level has become lower than the first liquid level. Then, the target substance is replenished in S21 and thereafter.

6.3 Effect

According to the fourth embodiment, the target supply device 264 further includes the liquid level sensor 73 that detects the amount of the target substance in the pressure tank C3. When the output of the liquid level sensor 73 indicates that the amount of the target substance in the pressure tank C3 is less than the first value, the valve V1 is opened and the pressure tank C3 is replenished with the target substance from the reservoir tank C1. Accordingly, when the amount of the target substance in the pressure tank C3 is equal to or greater than the first value, the target substance is not replenished, thereby preventing the target substance from overflowing from the pressure tank C3.

In other respects, the effect of the fourth embodiment is similar to that of the third embodiment.

7. Target Supply Device Replenishing Target Substance as Measuring Weight of Pressure Tank C3

In a fifth embodiment described below, the target substance is replenished when the weight of the pressure tank C3 has become less than the first weight.

7.1 Configuration

FIG. 13 schematically illustrates a configuration of a target supply device 265 according to the fifth embodiment.

The target supply device 265 includes a weight sensor 75 that detects the amount of the target substance in the pressure tank C3 by measuring the weight of the pressure tank C3. The weight sensor 75 is disposed at the lower end of the pressure tank C3 in the gravity direction. The weight sensor 75 may be, for example, a sensor that measures the weight of the pressure tank C3 by the output of a strain gauge.

In other respects, the configuration of the fifth embodiment is similar to that of the third embodiment.

Alternatively, in the fifth embodiment, similarly to the first embodiment, a configuration not including the bypass pipe L5 may be adopted.

Alternatively, in the fifth embodiment, similarly to the second embodiment, a configuration not including the adjustment mechanism 66 may be adopted.

7.2 Operation

FIG. 14 illustrates operation procedure of the target supply device 265 according to the fifth embodiment. The processes of S11 to S13 and S21 to S63 are similar to the corresponding processes in the third embodiment. In the fifth embodiment, the process of S14d is performed instead of S14.

In S14d, the target supply processor 60 waits until the weight of the pressure tank C3 becomes less than the first weight, and proceeds to the next step when the weight has become less than the first weight. Then, the target substance is replenished in S21 and thereafter.

7.3 Effect

According to the fifth embodiment, the target supply device 265 further includes a sensor, such as the weight sensor 75, for detecting the amount of the target substance in the pressure tank C3. When the output of the sensor indicates that the amount of the target substance in the pressure tank C3 is less than the first value, for example if the output of the weight sensor 75 indicates that the weight of the pressure tank C3 is less than the first weight, the valve V1 is opened and the pressure tank C3 is replenished with the target substance from the reservoir tank C1. Accordingly, when the amount of the target substance in the pressure tank C3 is equal to or greater than the first value, the target substance is not replenished, thereby preventing the target substance from overflowing from the pressure tank C3.

In other respects, the effect of the fifth embodiment is similar to that of the third embodiment.

8. Target Supply Device Replenishing Target Substance as Measuring Amount of Output Target Substance In a sixth embodiment described below, the target substance is replenished when the amount of the target substance output from the nozzle 72 has become equal to or greater than a first amount.

8.1 Configuration

Figure 15:
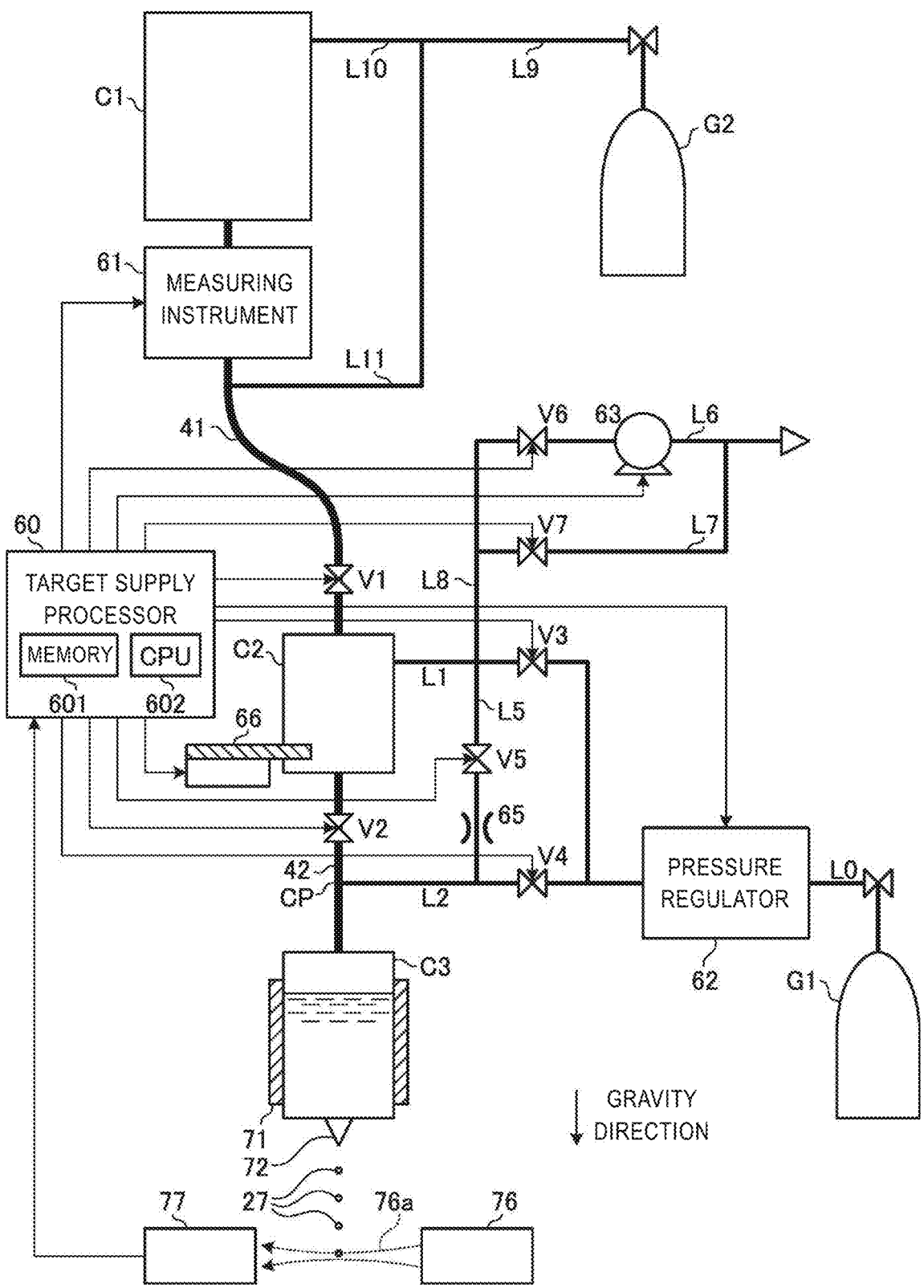
FIG. 15 schematically illustrates a configuration of a target supply device according to a sixth embodiment.

FIG. 15 schematically illustrates a configuration of a target supply device 266 according to the sixth embodiment.

The target supply device 266 includes a target sensor 77 for counting the number of targets 27 output from the nozzle 72. The target sensor 77 is used with a light source 76.

The light source 76 outputs illumination light 76a toward the trajectory of the target 27. When passing through the optical path of the illumination light 76a, the target 27 blocks a portion of the illumination light 76a or reflects a portion of the illumination light 76a.

The target sensor 77 includes, for example, an image sensor (not illustrated) and an optical system (not illustrated) that forms an image of an object located on the trajectory of the target 27 on a light receiving surface of the image sensor. The target sensor 77 receives light other than light 76a blocked by the target 27 or a portion of the light reflected by the target 27, and detects the target 27 by detecting a change of the intensity distribution of the light.

The target supply processor 60 counts the number of targets 27 that have passed through the optical path of the illumination light 76a based on the signal output from the target sensor 77. The amount of the target substance output from the nozzle 72 may be the number of targets 27 multiplied by the volume of one target 27. Thus, the target supply processor 60 can measure the amount of the target substance output from the nozzle 72.

In other respects, the configuration of the sixth embodiment is similar to that of the third embodiment.

Alternatively, in the sixth embodiment, similarly to the first embodiment, a configuration not including the bypass pipe L5 may be adopted.

Alternatively, in the sixth embodiment, similarly to the second embodiment, a configuration not including the adjustment mechanism 66 may be adopted.

8.2 Operation

FIG. 16 illustrates operation procedure of the target supply device 266 according to the sixth embodiment. The processes of S11 to S13 and S21 to S63 are similar to the corresponding processes in the third embodiment. In the sixth embodiment, the process of S14e is performed instead of S14.

In S14e, the target supply processor 60 waits until the amount of the target substance output from the nozzle 72 becomes equal to or greater than the first amount, and proceeds to the next step when the amount of the output target substance has become equal to or greater than the first amount. Then, the target substance is replenished in S21 and thereafter.

8.3 Effect

According to the sixth embodiment, the target supply device 266 further includes the target sensor 77 that measures the amount of the target substance output from the nozzle 72. When the output of the target sensor 77 indicates that the amount of the target substance output from the nozzle 72 is equal to or greater than the first amount, the valve V1 is opened and the pressure tank C3 is replenished with the target substance from the reservoir tank C1. Accordingly, when the amount of the target substance output from the nozzle 72 is less than the first amount, the target substance is not replenished, thereby preventing the target substance from overflowing from the pressure tank C3.

In other respects, the effect of the sixth embodiment is similar to that of the third embodiment.

9. Target Supply Device Stopping Replenishment of Target Substance when Liquid Level in Pressure Tank C3 has Become Equal to or Higher than Second Liquid Level In a seventh embodiment described below, the target substance is replenished when the liquid level of the target substance in the pressure tank C3 has become equal to or higher than the second liquid level.

9.1 Configuration

Figure 17:
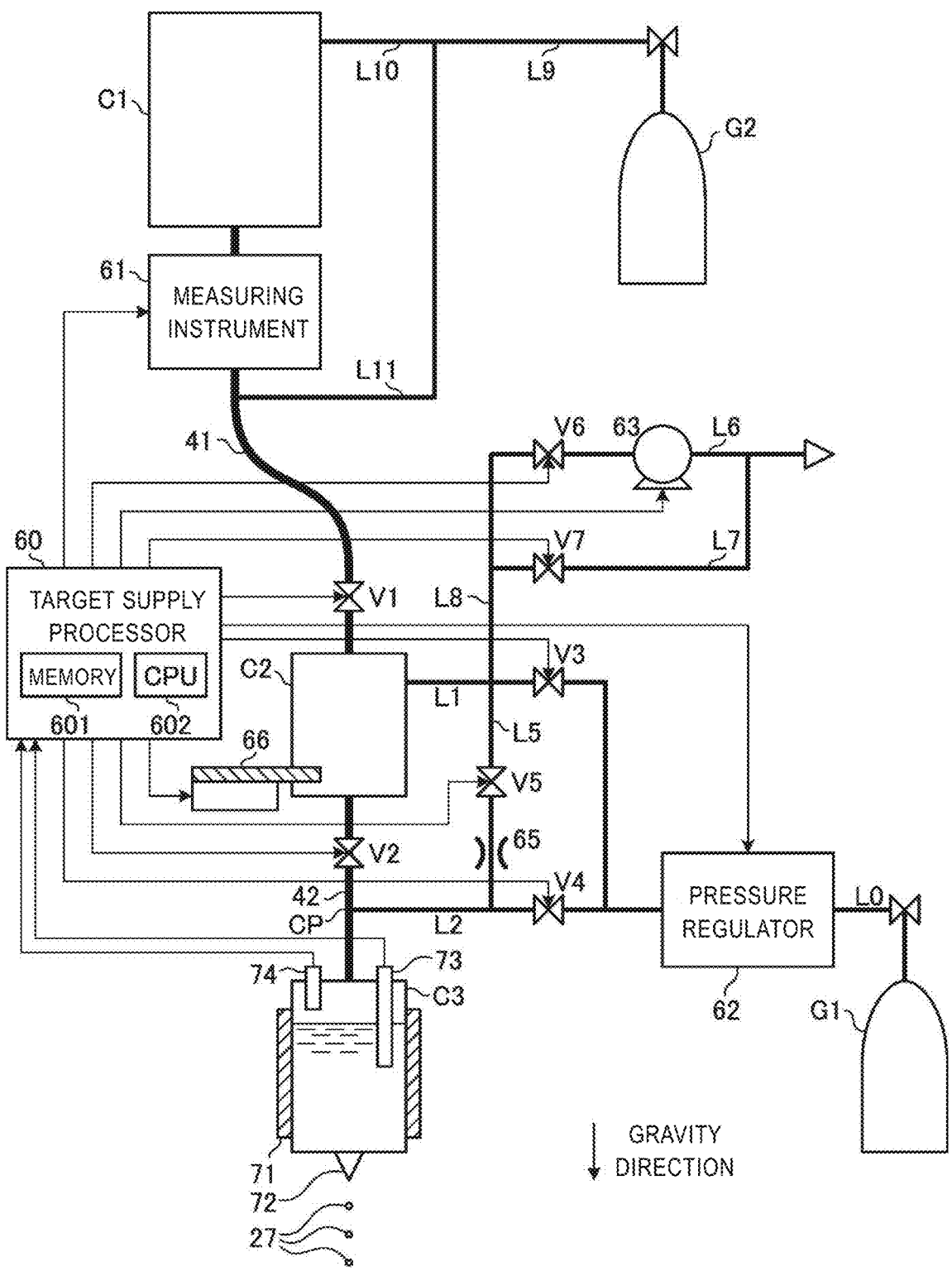
FIG. 17 schematically illustrates a configuration of a target supply device according to a seventh embodiment.

FIG. 17 schematically illustrates a configuration of a target supply device 267 according to the seventh embodiment. The target supply device 267 includes a liquid level sensor 74 in addition to the liquid level sensor 73. The liquid level sensor 74 differs from the liquid level sensor 73 in that it detects whether or not the height of the liquid level of the target substance is equal to or higher than the second liquid level higher than the first liquid level. In other respects, the configuration of the liquid level sensor 74 is similar to the configuration of the liquid level sensor 73.

In other respects, the configuration of the seventh embodiment is similar to that of the fourth embodiment.

Alternatively, in the seventh embodiment, similarly to the first embodiment, a configuration not including the bypass pipe L5 may be adopted.

Alternatively, in the seventh embodiment, similarly to the second embodiment, a configuration not including the adjustment mechanism 66 may be adopted.

9.2 Operation

Figure 18A:
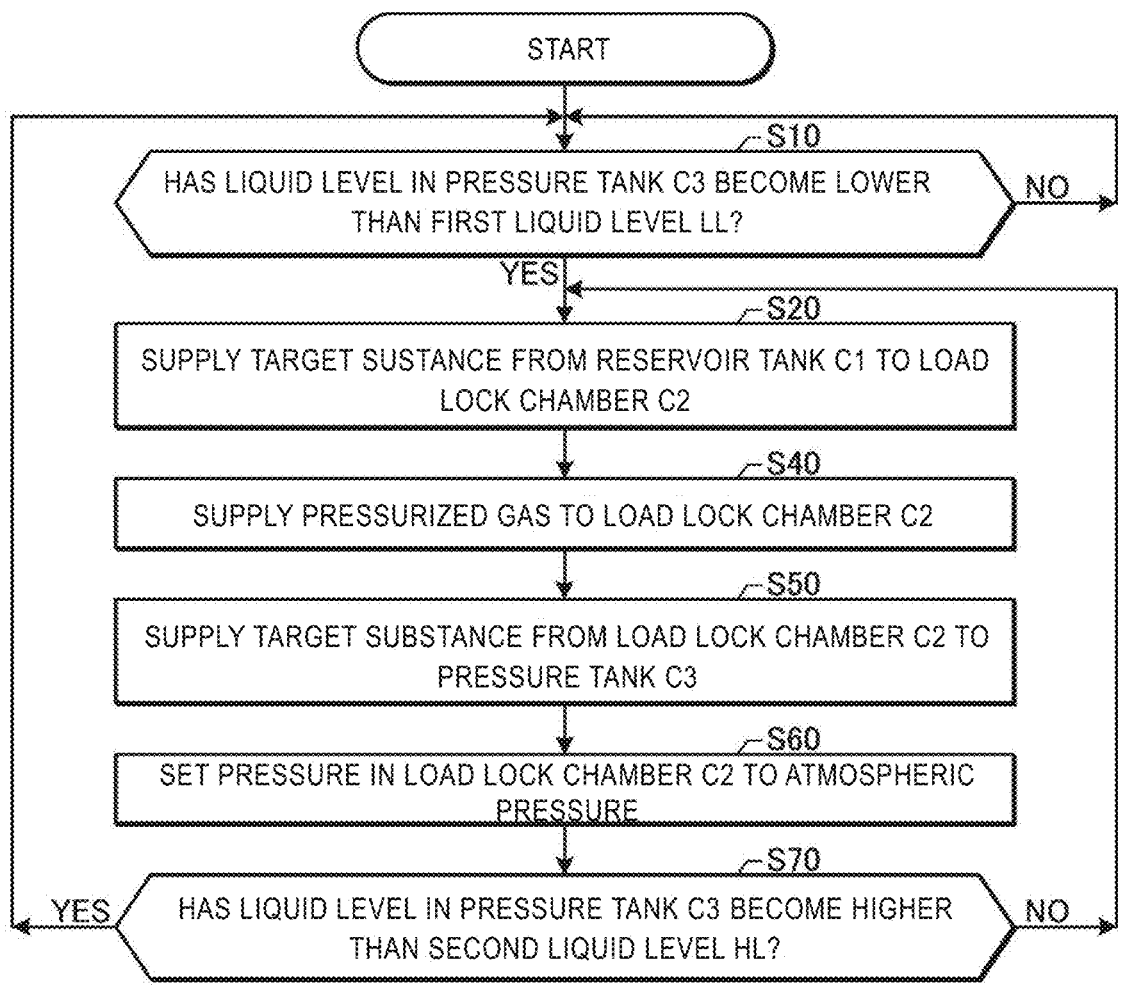
FIG. 18A is a flowchart illustrating operation procedure after the target supply device according to the seventh embodiment starts supplying a target.

FIG. 18A is a flowchart illustrating operation procedure after the target supply device 267 according to the seventh embodiment starts supplying the target 27.

In the following description, the first liquid level is referred to as a first liquid level LL, and the second liquid level is referred to as a second liquid level HL.

In S10, the target supply processor 60 determines whether or not the liquid level in the pressure tank C3 has become lower than the first liquid level LL. When the liquid level has become lower than the first liquid level LL (S10: YES), the target supply processor 60 advances processing to S20. When the liquid level is equal to or higher than the first liquid level LL (S10: NO), the target supply processor 60 waits without replenishing the target substance until the liquid level becomes lower than the first liquid level LL. This process is similar to S14c in FIG. 12 of the fourth embodiment.

In S20, the target supply processor 60 opens the valve V1 to supply the target substance from the reservoir tank C1 into the load lock chamber C2. This process is similar to S21 and S22 in FIG. 12. Then, the target supply processor 60 closes the valve V1.

In S40, the target supply processor 60 supplies the pressurized gas into the load lock chamber C2 by opening the valve V3. This process is similar to S41 in FIG. 12. Then, the target supply processor 60 closes the valve V3.

In S50, the target supply processor 60 opens the valve V2 and sets the adjustment mechanism 66 to the second state, thereby supplying the target substance from the load lock chamber C2 into the pressure tank C3. This process is similar to S52 and S53b in FIG. 12. Then, the target supply processor 60 closes the valve V2.

In S60, the target supply processor 60 opens the valve V7 to set the pressure in the load lock chamber C2 close to the atmospheric pressure. This process is similar to S61 in FIG. 12. Then, the target supply processor 60 closes the valve V7.

In S70, the target supply processor 60 determines whether or not the liquid level in the pressure tank C3 has become equal to or higher than the second liquid level HL.

When the liquid level has become equal to or higher than the second liquid level HL (S70: YES), the target supply processor 60 returns processing to S10 and waits without replenishing the target substance until the liquid level becomes lower than the first liquid level LL.

When the liquid level is lower than the second liquid level HL (S70: NO), the target supply processor 60 returns processing to S20 and further replenishes the target substance.

Figure 18B:
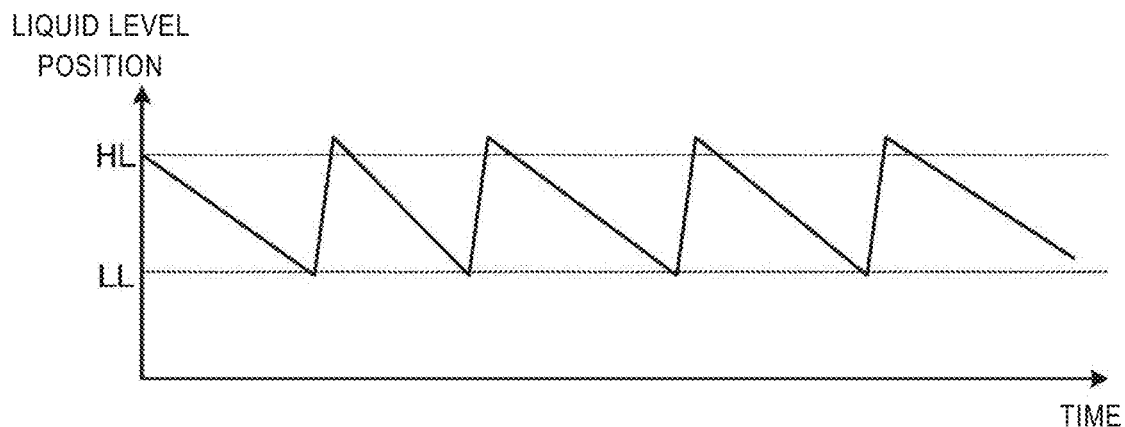
FIG. 18B is a graph illustrating an example of a change of the liquid level in a pressure tank in the seventh embodiment.

FIG. 18B is a graph illustrating an example of a change of the liquid level in the pressure tank C3 in the seventh embodiment. The horizontal axis represents time, and the vertical axis represents a liquid level position. When the target 27 is output to generate EUV light by the EUV light generation apparatus 1, the liquid level in the pressure tank C3 gradually decreases. The speed at which the liquid level decreases varies depending on the operating rate and operating conditions of the EUV light generation apparatus 1. In the seventh embodiment, regardless of the elapsed time, when the liquid level has become lower than the first liquid level LL (S10: YES), the target substance is replenished. When the target substance is replenished and the liquid level has become equal to or higher than the second liquid level HL (S70: YES), the replenishment of the target substance is stopped until the liquid level becomes lower than the first liquid level LL again.

9.3 Effect

According to the seventh embodiment, the target supply device 267 further includes a liquid level sensor 74 that detects the amount of the target substance in the pressure tank C3. In the seventh embodiment, when the output of the liquid level sensor 74 indicates that the liquid level of the target substance in the pressure tank C3 is equal to or higher than the second liquid level HL, waiting continues without replenishing the target substance while the valve V1 remains closed. Accordingly, when the amount of the target substance in the pressure tank C3 is equal to or greater than a second value, the target substance is not replenished, thereby preventing the target substance from overflowing from the pressure tank C3.

According to the seventh embodiment, when the output of the liquid level sensor 73 indicates that the liquid level of the target substance in the pressure tank C3 is lower than the first liquid level LL that is lower than the second liquid level HL after the output of the liquid level sensor 74 indicates that the liquid level of the target substance in the pressure tank C3 is equal to or higher than the second liquid level HL, the target supply device 267 opens the valve V1 to replenish the target substance. Accordingly, regardless of the speed at which the liquid level of the target substance decreases, the liquid level can repeatedly rise and fall between the liquid level in the vicinity of the first liquid level LL and the liquid level in the vicinity of the second liquid level HL.

In other respects, the effect of the seventh embodiment is similar to that of the fourth embodiment.

Alternatively, in the seventh embodiment, in S10, instead of determining whether or not the liquid level in the pressure tank C3 has become lower than the first liquid level LL, it may be determined whether or not the weight of the pressure tank C3 has become less than the first weight as in the fifth embodiment. In S70, instead of detecting that the liquid level in the pressure tank C3 has become higher than or equal to the second liquid level HL, it may be determined whether or not the weight of the pressure tank C3 has become equal to or greater than a second weight that is greater than the first weight.

Alternatively, in the seventh embodiment, in S10, instead of determining whether or not the liquid level in the pressure tank C3 has become lower than the first liquid level LL, it may be determined whether or not the amount of the target substance output from the nozzle 72 has become equal to or greater than the first amount, as in the sixth embodiment.

10. Target Supply Device Stopping Replenishment of Target Substance for Certain Time Period when Liquid Level in Pressure Tank C3 has Become Equal to or Higher than Second Liquid Level In an eighth embodiment described below, when the liquid level of the target substance in the pressure tank C3 has become equal to or higher than the second liquid level HL, the replenishment of the target substance is stopped for a certain time period.

The configuration of the eighth embodiment is similar to that of the seventh embodiment. However, in the eighth embodiment, the liquid level sensor 73 for detecting the first liquid level LL may not be provided.

10.1 Operation

Figure 19A:
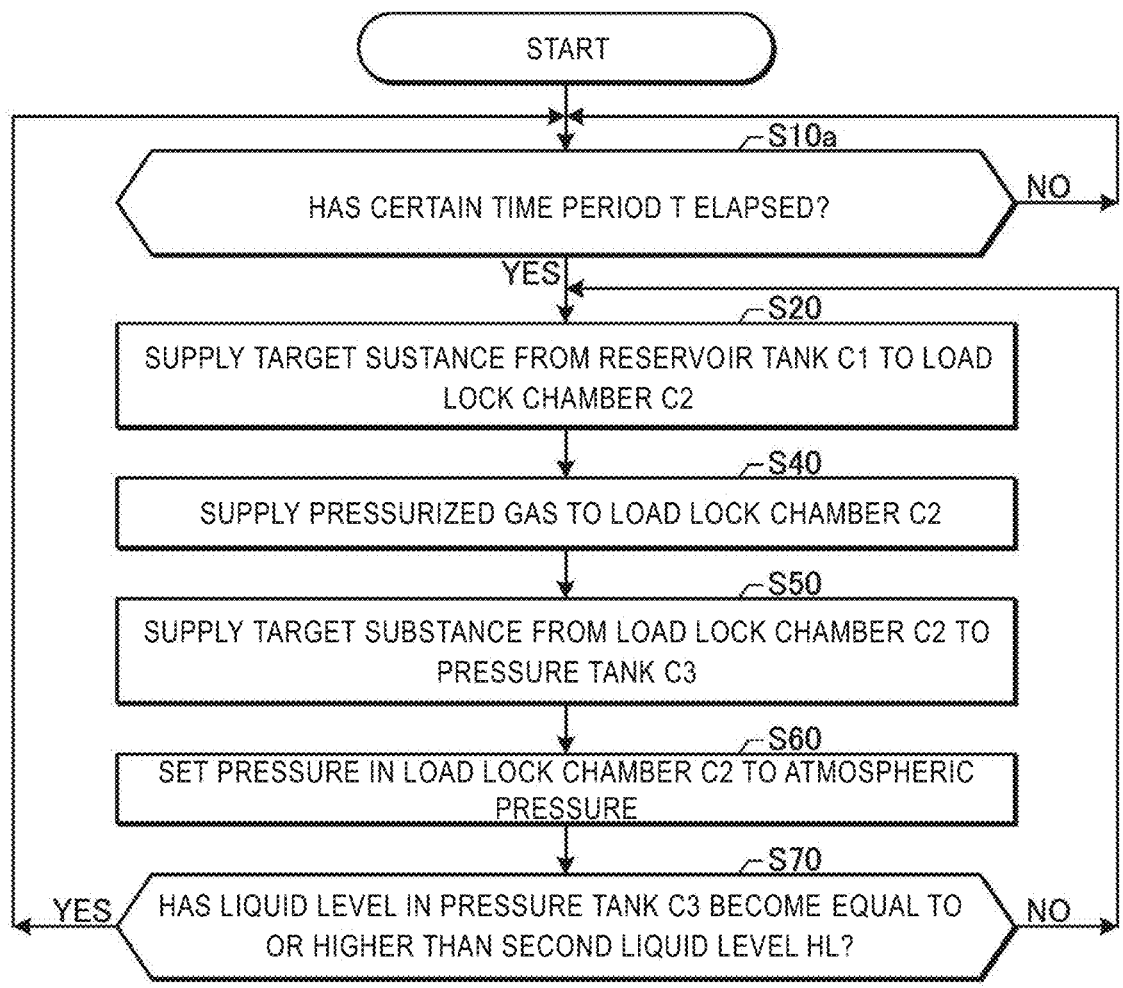
FIG. 19A is a flowchart illustrating operation procedure after the target supply device according to the eighth embodiment starts supplying the target.

FIG. 19A is a flowchart illustrating operation procedure after the target supply device 267 according to the eighth embodiment starts supplying the target 27.

In S10a, the target supply processor 60 determines whether or not a certain time period T has elapsed. When the certain time period T has elapsed (S10a: YES), the target supply processor 60 advances processing to S20. When the certain time period T has not elapsed (S10a: NO), the target supply processor 60 waits without replenishing the target substance until the certain time period T elapses. This process is similar to S14 in FIG. 10.

The subsequent processes of S20 to S70 are similar to the corresponding processes in FIG. 18A. Thus, the target substance is replenished from the reservoir tank C1 to the pressure tank C3, and it is determined in S70 whether or not the liquid level in the pressure tank C3 has become equal to or higher than the second liquid level HL.

When the liquid level has become equal to or higher than the second liquid level HL (S70: YES), the target supply processor 60 returns the process to S10a and stops the replenishment of the target substance until the certain time period T elapses.

When the liquid level is lower than the second liquid level HL (S70: NO), the target supply processor 60 returns processing to S20 and further replenishes the target substance.

Figure 19B:
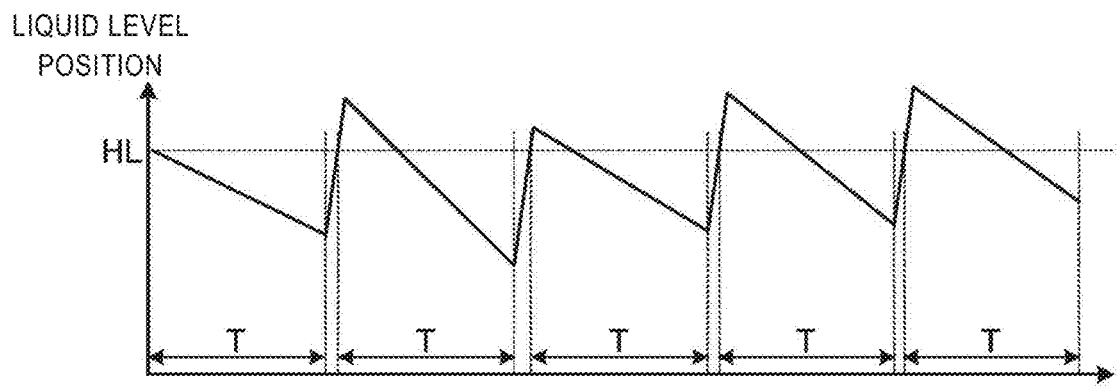
FIG. 19B is a graph illustrating an example of a change of the liquid level in the pressure tank in the eighth embodiment.

FIG. 19B is a graph illustrating an example of a change of the liquid level in the pressure tank C3 in the eighth embodiment. The horizontal axis represents time, and the vertical axis represents the liquid level position. When the target 27 is output to generate EUV light by the EUV light generation apparatus 1, the liquid level in the pressure tank C3 gradually decreases. The speed at which the liquid level decreases varies depending on the operating rate and operating conditions of the EUV light generation apparatus 1. In the eighth embodiment, the target substance is replenished when the certain time period T elapses after the liquid level becomes equal to or higher than the second liquid level HL (S10a: YES) regardless of the speed at which the liquid level decreases. When the target substance is replenished and the liquid level has become equal to or higher than the second liquid level HL (S70: YES), the replenishment of the target substance is stopped until the certain time period T elapses again.

In other respects, the operation of the eighth embodiment is similar to that of the seventh embodiment.

10.2 Effect

According to the eighth embodiment, in the target supply device 267, when the certain time period T elapses after the output of the liquid level sensor 74 indicates that the liquid level of the target substance in the pressure tank C3 is equal to or higher than the second liquid level HL, the valve V1 is opened and the target substance is replenished. Accordingly, even when the liquid level sensor 73 for detecting the first liquid level LL is not provided, the target substance can be replenished every elapse of the certain time period T.

In other respects, the effect of the eighth embodiment is similar to that of the seventh embodiment.

Alternatively, in the eighth embodiment, in S70, instead of detecting that the liquid level in the pressure tank C3 has become equal to or higher than the second liquid level HL, it may be determined whether or not the weight of the pressure tank C3 has become equal to or greater than the second weight.

11. Target Supply Device Starting Measurement for Certain Time Period when Liquid Level in Pressure Tank C3 has Become Lower than Second Liquid Level In a ninth embodiment described below, the measurement of the certain time period T is started when the liquid level of the target substance in the pressure tank C3 has become lower than the second liquid level HL after the liquid level of the target substance becomes equal to or higher than the second liquid level HL.

The configuration of the ninth embodiment is similar to that of the seventh embodiment. However, in the ninth embodiment, the liquid level sensor 73 for detecting the first liquid level LL may not be provided.

11.1 Operation

Figure 20A:
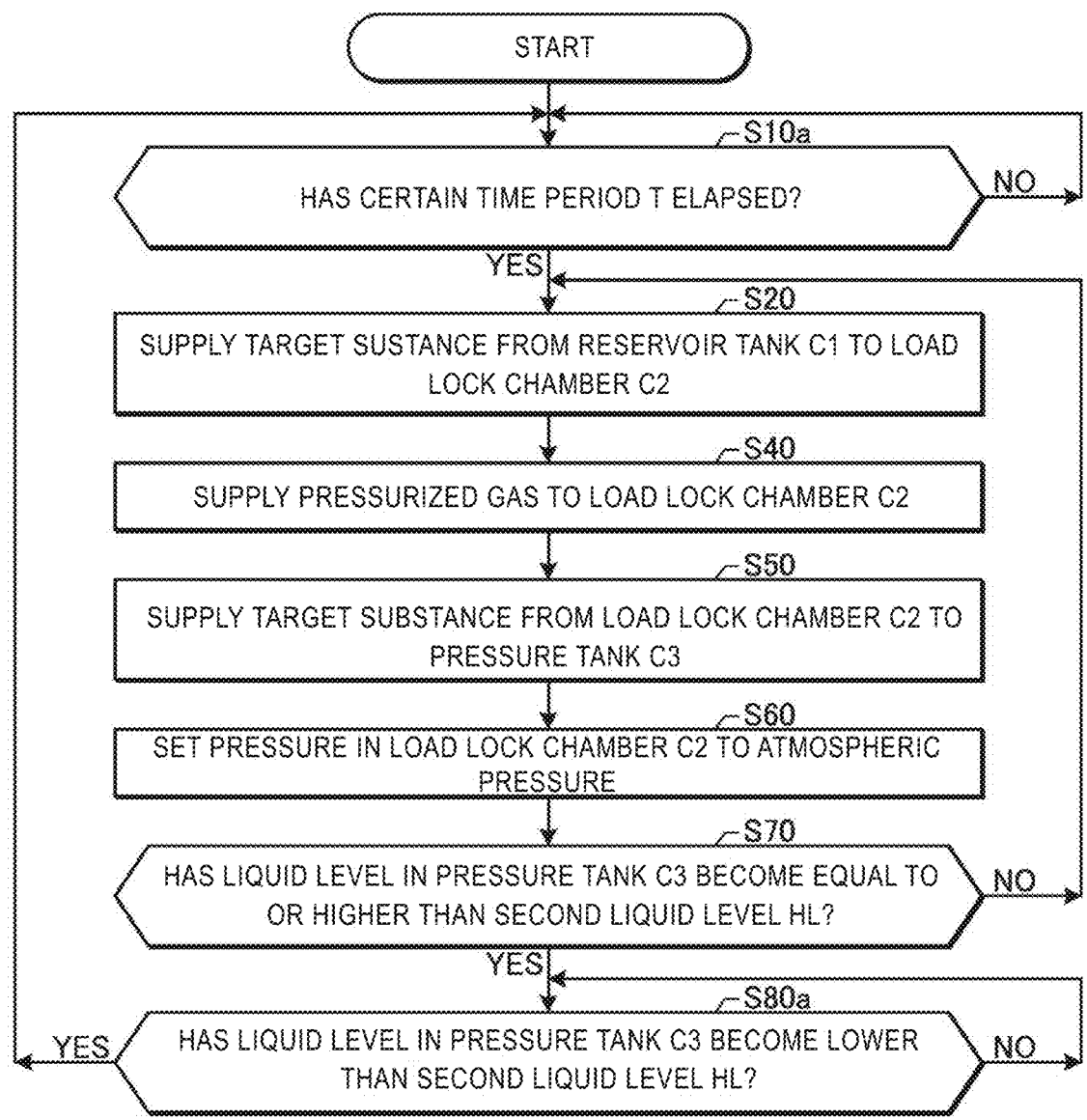
FIG. 20A is a flowchart illustrating operation procedure after the target supply device according to the ninth embodiment starts supplying the target.

FIG. 20A is a flowchart illustrating operation procedure after the target supply device 267 according to the ninth embodiment starts supplying the target 27.

The processes of S10a to S70 is similar to the corresponding processes in FIG. 19A. Thus, the target substance is replenished from the reservoir tank C1 to the pressure tank C3, and it is determined in S70 whether or not the liquid level in the pressure tank C3 has become equal to or higher than the second liquid level HL.

After the liquid level becomes equal to or higher than the second liquid level HL (S70: YES), when the liquid level has become lower than the second liquid level HL (S80a: YES), the target supply processor 60 returns processing to S10a and stops the replenishment of the target substance until the certain time period T elapses.

When the liquid level is equal to or higher than the second liquid level HL (S70: YES, S80a: NO), waiting continues without starting the measurement of the certain time period T until the liquid level becomes lower than the second liquid level HL.

Figure 20B:
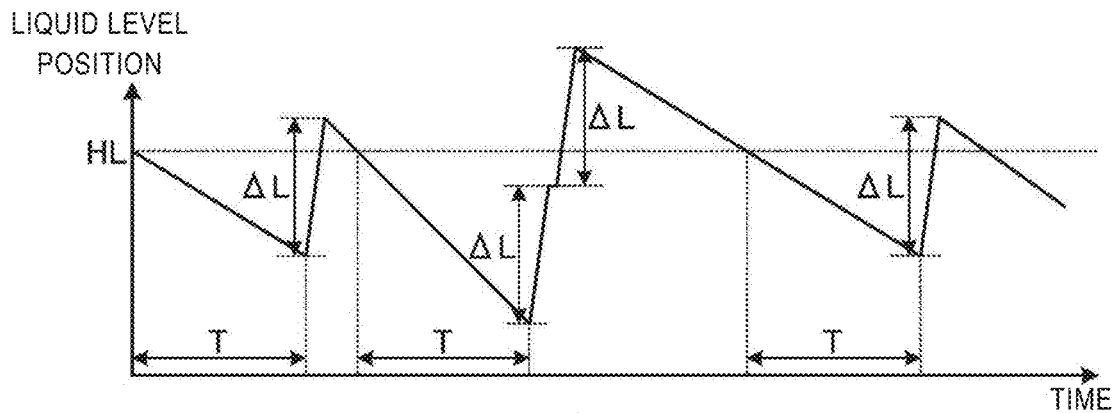
FIG. 20B is a graph illustrating an example of a change of the liquid level in the pressure tank in the ninth embodiment.

FIG. 20B is a graph illustrating an example of a change of the liquid level in the pressure tank C3 in the ninth embodiment. The horizontal axis represents time, and the vertical axis represents the liquid level position. When the target 27 is output to generate EUV light by the EUV light generation apparatus 1, the liquid level in the pressure tank C3 gradually decreases. The speed at which the liquid level decreases varies depending on the operating rate and operating conditions of the EUV light generation apparatus 1. In the ninth embodiment, the target substance is replenished when the certain time period T elapses after the liquid level becomes lower than the second liquid level HL (S10a: YES) regardless of the speed at which the liquid level decreases.

When the target substance is replenished and the liquid level has become equal to or higher than the second liquid level HL (S70: YES), the replenishment of the target substance is stopped until the certain time period T elapses after the liquid level becomes lower than the second liquid level HL again.

Since the amount of the target substance replenished from the reservoir tank C1 to the pressure tank C3 is a fixed amount measured by the measuring instrument 61, a rise width $\Delta L$ of the liquid level due to the replenishment of the target substance is substantially constant each time. However, since the height of the liquid level at the start of replenishment varies, the height of the liquid level at the end of replenishment also varies. By starting the measurement of a certain time period T when the liquid level has become lower than the second liquid level HL, it is possible to reduce the variation in the height of the liquid level at the start of the next replenishment.

In other respects, the operation of the ninth embodiment is similar to that of the eighth embodiment.

11.2 Effect

According to the ninth embodiment, when the output of the liquid level sensor 74 indicates that the liquid level of the target substance in the pressure tank C3 has become equal to or higher than the second liquid level HL and then has become lower than the second liquid level HL, the valve V1 is opened and the target substance is replenished. Accordingly, even if there is a variation in the height of the liquid level at the end of the replenishment, it is possible to reduce the variation in the height of the liquid level at the start of the next replenishment.

In other respects, the effect of the ninth embodiment is similar to that of the eighth embodiment.

Alternatively, in the eighth embodiment, in S70, instead of detecting that the liquid level in the pressure tank C3 has become equal to or higher than the second liquid level HL, it may be determined whether or not the weight of the pressure tank C3 has becomes equal to or greater than the second weight. Further, in S80a, instead of detecting that the liquid level in the pressure tank C3 has become lower than the second liquid level HL, it may be determined whether or not the weight of the pressure tank C3 has become less than the second weight.

12. Others

Figure 21:
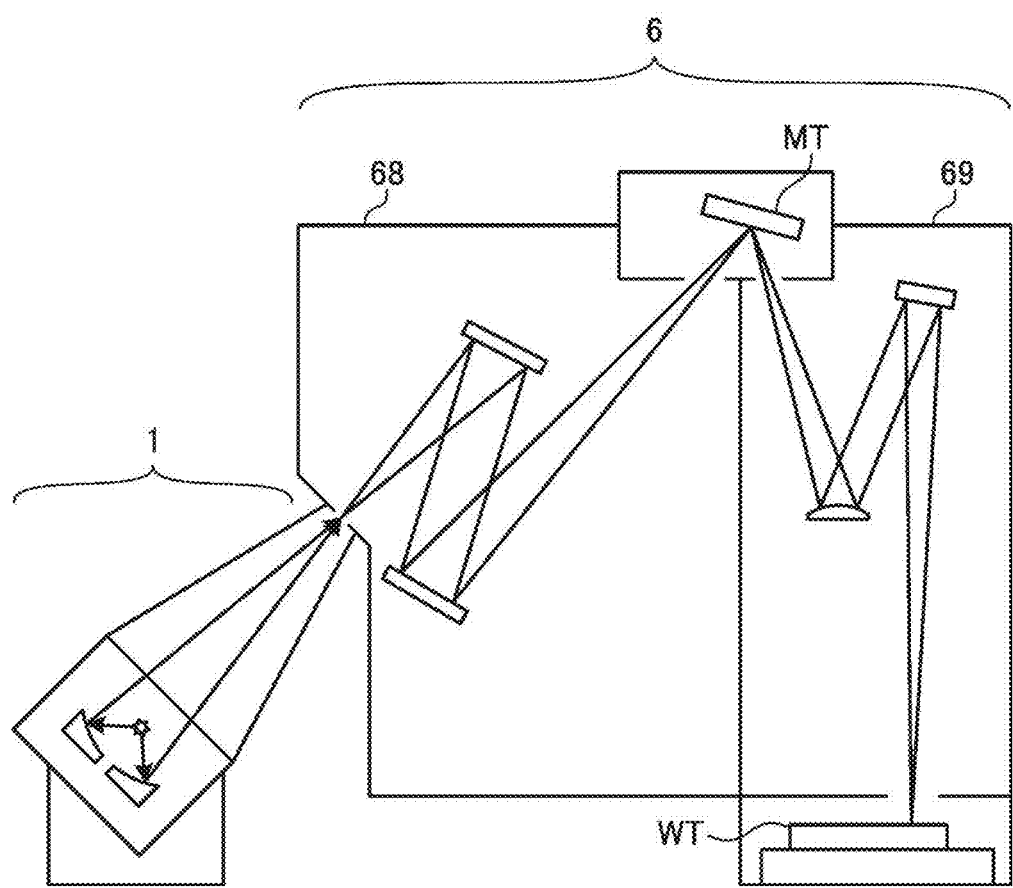
FIG. 21 schematically illustrates a configuration of an exposure apparatus connected to an EUV light generation apparatus.

FIG. 21 schematically illustrates a configuration of the exposure apparatus 6 connected to the EUV light generation apparatus 1.

In FIG. 21, the exposure apparatus 6 includes a mask irradiation unit 68 and a workpiece irradiation unit 69. The mask irradiation unit 68 illuminates, through the reflection optical system, the mask pattern of the mask table MT with the EUV light incident from the EUV light generation apparatus 1. The workpiece irradiation unit 69 images the EUV light reflected by the mask table MT onto a workpiece (not illustrated) disposed on the workpiece table WT through the reflection optical system. The workpiece is a photosensitive substrate such as a semiconductor wafer on which photoresist is applied. The exposure apparatus 6 synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A target supply device comprising:
    a first container configured to contain a target substance;
    a second container configured to contain the target substance supplied from the first container;
    a first valve disposed between the first container and the second container;
    a first pipe connected to the second container and configured to supply pressurized gas to the second container;
    a third container configured to contain the target substance supplied from the second container;
    a second valve disposed between the second container and the third container;
    a second pipe connected to the third container and configured to supply pressurized gas to the third container; and
    a nozzle configured to output the target substance supplied from the third container;
    a pressurized gas pipe commonly used to supply pressurized gas to the first pipe and the second pipe;
    a third valve disposed at the first pipe between the second container and the pressurized gas pipe;
    a fourth valve disposed at the second pipe between the third container and the pressurized gas pipe; and
    a processor,
    wherein the processor controls the first valve, the second valve, the third valve, and the fourth valve so that, in a state that the second valve is closed, the first valve is opened to supply the target substance from the first container to the second container, subsequently the first valve and fourth valve are closed, and then the third valve is opened to supply pressurized gas to the second container, and then, the second valve is opened to supply the target substance from the second container to the third container.

2. The target supply device according to claim 1, further comprising:
    an exhaust pump configured to exhaust gas inside the second container,
    wherein the processor controls the first valve, the second valve, the third valve, and the exhaust pump so that, in a state that the second valve is closed, the first valve is opened to supply the target substance from the first container to the second container, the first valve is closed and gas inside the second container is exhausted by the exhaust pump, and then the third valve is opened to supply pressurized gas to the second container, and then, the second valve is opened to supply the target substance from the second container to the third container.

3. The target supply device according to claim 1, further comprising:
    a measuring instrument disposed between the first container and the first valve and configured to measure the target substance supplied from the first container,
    wherein the processor controls the measuring instrument to stop passing of the target substance after allowing passing of a predetermined amount of the target substance, and controls the first valve so that the first valve is opened before the measuring instrument allows passing of the target substance and the first valve is closed after the predetermined amount of the target substance having passed through the measuring instrument passes through the first valve.

4. The target supply device according to claim 1,
    wherein temperature in the first container and temperature in the second container are lower than a melting point of the target substance, and temperature in the third container is higher than the melting point of the target substance.

5. The target supply device according to claim 1, further comprising:
    a supply pipe, at which the second valve is disposed, disposed between the second container and the third container,
    wherein the second pipe is connected to the third container by being connected to the supply pipe between the second valve and the third valve.

6. The target supply device according to claim 1, further comprising:
    a bypass pipe which bypasses the second valve to connect the second container and the third container;
    a fifth valve disposed at the bypass pipe; and
    a flow rate suppressing unit configured to suppress a flow rate of the bypass pipe.

7. The target supply device according to claim 6,
    wherein the processor controls the first valve, the second valve, the third valve, and the fifth valve so that, in a state that the second valve is closed, the first valve is opened to supply the target substance from the first container to the second container, the first valve is closed and the third valve is opened to supply the pressurized gas to the second container, and then, the fifth valve is opened and subsequently the second valve is opened to supply the target substance from the second container to the third container.

8. The target supply device according to claim 1, further comprising:
    an adjustment mechanism configured to be switched between a first state in which the target substance supplied to the second container is prevented from reaching the second valve and a second state in which the target substance supplied to the second container is allowed to reach the second valve.

9. The target supply device according to claim 8,
    wherein the second valve is a ball valve, and the processor controls the first valve, the second valve, and the adjustment mechanism so that the first valve is opened when the second valve is closed and the adjustment mechanism is in the first state, and the adjustment mechanism is in the second state when the first valve is closed and the second valve is opened.

10. The target supply device according to claim 1, further comprising:
    a sensor for detecting an amount of the target substance in the third container, wherein the processor controls the first valve so that the first valve is opened when an output of the sensor indicates that an amount of the target substance in the third container is less than a first value.

11. The target supply device according to claim 10, wherein the sensor is one of a liquid level sensor and a weight sensor.

12. The target supply device according to claim 1, further comprising:
a target sensor configured to measure an amount of the target substance output from the nozzle,
wherein the processor controls the first valve so that the first valve is opened when an output of the target sensor indicates that the amount of the target substance output from the nozzle is equal to or greater than a first amount.

13. The target supply device according to claim 1, further comprising:
a sensor configured to detect an amount of the target substance in the third container,
wherein the processor controls the first valve so that the first valve waits as remaining closed when an output of the sensor indicates that the amount of the target substance in the third container is equal to or greater than a second value.

14. The target supply device according to claim 13,
wherein the processor controls the first valve so that the first valve is opened when the output of the sensor indicates that the amount of the target substance in the third container is less than a first value that is less than the second value after the output of the sensor indicates that the amount of the target substance in the third container is equal to or greater than the second value.

15. The target supply device according to claim 13,
wherein the processor controls the first valve so that the first valve is opened when a certain time period elapses after the output of the sensor indicates that the amount of the target substance in the third container is equal to or greater than the second value.

16. The target supply device according to claim 13,
wherein the processor controls the first valve so that the first valve is opened when a certain time period elapses after the output of the sensor indicates that the amount of the target substance in the third container is equal to or greater than the second value and then becomes less than the second value.

17. A target supply method with an extreme ultraviolet light generation apparatus using a target supply device, the method comprising:
in a state that a second valve is closed, opening a first valve to supply a target substance from a first container to a second container and closing the first valve to supply pressurized gas to the second container, and then;
opening the second valve to supply the target substance from the second container to a third container,
the target supply device including:
the first container configured to contain the target substance;
the second container configured to contain the target substance supplied from the first container;
the first valve disposed between the first container and the second container;
a first pipe connected to the second container and configured to supply pressurized gas to the second container;
the third container configured to contain the target substance supplied from the second container;
the second valve disposed between the second container and the third container;
a second pipe connected to the third container and configured to supply pressurized gas to the third container; and
a nozzle configured to output the target substance supplied from the third container;
a pressurized gas pipe commonly used to supply pressurized gas to the first pipe and the second pipe;
a third valve disposed at the first pipe between the second container and the pressurized gas pipe;
a fourth valve disposed at the second pipe between the third container and the pressurized gas pipe; and
a processor,
wherein the processor controls the first valve, the second valve, the third valve, and the fourth valve so that, in a state that the second valve is closed, the first valve is opened to supply the target substance from the first container to the second container, subsequently the first valve and fourth valve are closed, and then the third valve is opened to supply pressurized gas to the second container, and then, the second valve is opened to supply the target substance from the second container to the third container.

18. An electronic device manufacturing method, comprising:
generating extreme ultraviolet light by irradiating a target substance with pulsed laser light in an extreme ultraviolet light generation apparatus;
emitting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a target supply device; and
a laser light concentrating mirror configured to concentrate pulsed laser light on the target substance output to a predetermined region from the target supply device,
the target supply device including:
a first container configured to contain the target substance;
a second container configured to contain the target substance supplied from the first container;
a first valve disposed between the first container and the second container;
a first pipe connected to the second container and configured to supply pressurized gas to the second container;
a third container configured to contain the target substance supplied from the second container;
a second valve disposed between the second container and the third container;
a second pipe connected to the third container and configured to supply pressurized gas to the third container; and
a nozzle configured to output the target substance supplied from the third container;
a pressurized gas pipe commonly used to supply pressurized gas to the first pipe and the second pipe;
a third valve disposed at the first pipe between the second container and the pressurized gas pipe;
a fourth valve disposed at the second pipe between the third container and the pressurized gas pipe; and
a processor, wherein the processor controls the first valve, the second valve, the third valve, and the fourth valve so that, in a state that the second valve is closed, the first valve is opened to supply the target substance from the first container to the second container, subsequently the first valve and fourth valve are closed, and then the third valve is opened to supply pressurized gas to the second container, and then, the second valve is opened to supply the target substance from the second container to the third container.

19. A target supply device comprising:

a first container configured to contain a target substance;

a second container configured to contain the target substance supplied from the first container;

a first valve disposed between the first container and the second container;

a first pipe connected to the second container and configured to supply pressurized gas to the second container;

a third container configured to contain the target substance supplied from the second container;

a second valve disposed between the second container and the third container;

a second pipe connected to the third container and configured to supply pressurized gas to the third container;

a nozzle configured to output the target substance supplied from the third container;

a bypass pipe which bypasses the second valve to connect the second container and the third container;

a fifth valve disposed at the bypass pipe; and a flow rate suppressing unit configured to suppress a flow rate of the bypass pipe.

* * * * *